US009722044B2

(12) United States Patent
Tsunomura et al.

(10) Patent No.: US 9,722,044 B2
(45) Date of Patent: Aug. 1, 2017

(54) MANUFACTURING METHOD OF SEMICONDUCTOR DEVICE WITH SILICON LAYER CONTAINING CARBON

(71) Applicant: RENESAS ELECTRONICS CORPORATION, Tokyo (JP)

(72) Inventors: Takaaki Tsunomura, Tokyo (JP); Toshiaki Iwamatsu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/990,242

(22) Filed: Jan. 7, 2016

(65) Prior Publication Data
US 2016/0118476 A1    Apr. 28, 2016

Related U.S. Application Data

(62) Division of application No. 14/155,708, filed on Jan. 15, 2014, now Pat. No. 9,263,346.

(30) Foreign Application Priority Data

Jan. 18, 2013    (JP) .................................. 2013-7425

(51) Int. Cl.
*H01L 29/66*    (2006.01)
*H01L 29/36*    (2006.01)
(Continued)

(52) U.S. Cl.
CPC ...... *H01L 29/66537* (2013.01); *H01L 21/265* (2013.01); *H01L 21/2652* (2013.01);
(Continued)

(58) Field of Classification Search
CPC ....... H01L 21/2652; H01L 2924/04642; H01L 21/26506; H01L 27/103; H01L 29/78603;
(Continued)

(56) References Cited

U.S. PATENT DOCUMENTS 6,069,046 A * 5/2000 Gardner .............. H01L 21/2652
257/E21.206
6,436,783 B1    8/2002 Ono et al.
(Continued)

FOREIGN PATENT DOCUMENTS

JP    2000-031481 A    1/2000
JP    2011-010740 A    4/2001
(Continued)

*Primary Examiner* — Kevin Parendo
(74) *Attorney, Agent, or Firm* — Foley & Lardner LLP

(57) ABSTRACT

A semiconductor device having an n channel MISFET formed on an SOI substrate including a support substrate, an insulating layer formed on the support substrate and a silicon layer formed on the insulating layer has the following structure. An impurity region for threshold adjustment is provided in the support substrate of a gate electrode so that the silicon layer contains carbon. The threshold value can be adjusted by the semiconductor region for threshold adjustment in this manner. Further, by providing the silicon layer containing carbon, even when the impurity of the semiconductor region for threshold adjustment is diffused to the silicon layer across the insulating layer, the impurity is inactivated by the carbon implanted into the silicon layer. As a result, the fluctuation of the transistor characteristics, for example, the fluctuation of the threshold voltage of the MISFET can be reduced.

6 Claims, 31 Drawing Sheets

(51) Int. Cl.

| | |
|---|---|
| *H01L 21/365* | (2006.01) |
| *H01L 21/324* | (2006.01) |
| *H01L 29/06* | (2006.01) |
| *H01L 29/786* | (2006.01) |
| *H01L 21/84* | (2006.01) |
| *H01L 27/12* | (2006.01) |
| *H01L 21/265* | (2006.01) |

(52) U.S. Cl.
CPC ...... *H01L 21/26506* (2013.01); *H01L 21/324* (2013.01); *H01L 21/84* (2013.01); *H01L 27/1203* (2013.01); *H01L 29/0649* (2013.01); *H01L 29/36* (2013.01); *H01L 29/66742* (2013.01); *H01L 29/78603* (2013.01); *H01L 29/78684* (2013.01)

(58) Field of Classification Search
CPC ........... H01L 29/78684; H01L 29/0649; H01L 26/36; H01L 29/66537; H01L 21/7624–21/76291; H01L 27/1203–27/1211
See application file for complete search history.

(56) References Cited

U.S. PATENT DOCUMENTS

| | | | |
|---|---|---|---|
| 7,811,873 | B2 | 10/2010 | Mochizuki |
| 8,513,081 | B2 | 8/2013 | Guo et al. |
| 2006/0068556 | A1* | 3/2006 | Noda .................. H01L 21/2253 438/305 |
| 2007/0128742 | A1 | 6/2007 | Lee et al. |
| 2009/0194789 | A1 | 8/2009 | Griebenow et al. |
| 2009/0224321 | A1 | 9/2009 | Tsuchiya |
| 2010/0001787 | A1 | 1/2010 | Brunsilius et al. |
| 2012/0049293 | A1 | 3/2012 | Scheiper et al. |
| 2012/0119294 | A1 | 5/2012 | Greene et al. |
| 2013/0015525 | A1 | 1/2013 | Cheng et al. |

FOREIGN PATENT DOCUMENTS

| | | |
|---|---|---|
| JP | 2001-156291 A | 6/2001 |
| JP | 2007-103492 A | 4/2007 |
| JP | 2008-085253 A | 4/2008 |
| JP | 2009-212413 A | 9/2009 |
| JP | 2011-138826 A | 7/2011 |

* cited by examiner

MANUFACTURING METHOD OF SEMICONDUCTOR DEVICE WITH SILICON LAYER CONTAINING CARBON

CROSS-REFERENCE TO RELATED APPLICATIONS

This application is a divisional of U.S. application Ser. No. 14/155,708, filed on Jan. 15, 2014, which claims benefit of priority from the prior Japanese Application No. 2013-007425, filed on Jan. 18, 2013; the entire contents of all of which are incorporated herein by reference.

TECHNICAL FIELD

The present invention relates to a semiconductor device and a manufacturing method of a semiconductor device, and it can be suitably utilized for, for example, a semiconductor device having a MISFET disposed on an SOI substrate and a manufacturing method thereof.

BACKGROUND

The adoption of an SOI (Silicon On Insulator) substrate has been examined for achieving the improvement in performances of LSI such as the reduction of power consumption and the speed-up.

For example, in the process disclosed in Japanese Patent Application Laid-Open Publication No. 2007-103492 (Patent Document 1), when forming a LOCOS layer (15) on an SOI substrate (10) and then forming an n type SOI transistor (100) in an element region surrounded by the LOCOS layer (15), boron (B) for preventing a parasitic channel is introduced into an end part (30) of a channel region. Also, fluorine (F) or carbon (C) is introduced as a diffusion suppressing atom for suppressing the diffusion of B into the end part (30) of the channel region (see FIG. 2 and paragraphs [0029] to [0033]). By introducing the diffusion suppressing atom in this manner, the diffusion of B in the end part (30) of the channel region is suppressed, and the reduction in the concentration of B in the end part (30) of the channel region can be suppressed. By this means, since the formation of the parasitic channel which is easily inverted to an n type can be suppressed, it is possible to provide a semiconductor device having such features as small leakage current, high speed operation and low power consumption.

Also, in Japanese Patent Application Laid-Open Publication No. 2011-138826 (Patent Document 2), a substrate (11) having a structurally-altered layer (12) is disclosed as a substrate for semiconductor device. As the substrate (11), a silicon substrate, a gallium-arsenic compound semiconductor substrate and others can be adopted, and the structurally-altered layer (12) is formed by implanting ions which do not form any conductivity-type region from one surface of the silicon substrate (11) in a thickness direction (see paragraphs [0034] to [0039]). Further, the Patent Document 2 discloses an SOI substrate having a crystalline insulating layer (21) formed in a region at a depth of 1 to 2 μm from an ion implantation surface of the silicon substrate (11) and the structurally-altered layer (12) formed in a region at a depth of 5 to 50 μm from the ion implantation surface of the silicon substrate (11) (see paragraphs [0068] to [0072]).

Also, Japanese Patent Application Laid-Open Publication No. 2000-31481 (Patent Document 3) indicates that the activation rate of impurities is reduced to half to one-tenth when both of boron and carbon are doped as channel impurities.

For its solution, in the MOSFET disclosed in the Patent Document 3, a carbon-doped layer is provided at a position away from the surface of the silicon substrate, and thereby solving the problems of threshold variation and increase of parasitic resistance without causing the inactivation of impurities.

Also, Japanese Patent Application Laid-Open Publication No. 2008-85253 (Patent Document 4) discloses a MOSFET in which impurities are efficiently moved locally to a part of an SOI layer near an interface with a gate insulating film by excessive enhanced diffusion, and as a result, the impurity concentration on a front surface side of a channel region of a completely depleted SOI layer becomes higher than that on a buried insulating film side. Japanese Patent Application Laid-Open Publication No. 2001-110740 (Patent Document 5) discloses that an interstitial-silicon high-concentration layer with high silicon density is formed near a surface of a semiconductor substrate by the ion implantation of Si or Ge. Japanese Patent Application Laid-Open Publication No. 2001-156291 (Patent Document 6) discloses a technique in which enhanced diffusion of fluorine is effectively prevented even when fluorine is introduced in a state where channel impurities are present and Si—F bonds are efficiently formed in the channel region. More specifically, after annihilating interstitial silicon atoms generated by the ion implantation of fluorine by the first heat treatment, fluorine is moved to the channel region by the second heat treatment, and thereby forming Si—F bonds at high efficiency.

Note that numbers in parentheses in the descriptions above correspond to the reference numbers in the respective Patent Documents.

SUMMARY

The inventors of the present invention have studied about the improvement in performances of a semiconductor device having a MISFET disposed on an SOI substrate.

As a result of the studies of the semiconductor device whose controllability of a threshold value is improved by introducing impurities into a region below a BOX layer of an SOI substrate, it is found that there are still a lot of things to do for the improvement of overall characteristics of the semiconductor device.

The above and other objects and novel characteristics of the present invention will be apparent from the description of the present specification and the accompanying drawings.

The following is a brief description of an outline of the typical invention disclosed in the present application.

A semiconductor device described in an embodiment disclosed in this application includes a field effect transistor formed on a substrate having a semiconductor substrate, an insulating layer formed on the semiconductor substrate, and a semiconductor layer formed on the insulating layer. Also, the semiconductor device further includes a semiconductor region disposed in the semiconductor substrate below a gate electrode of the field effect transistor via the semiconductor layer and the insulating layer.

A manufacturing method of a semiconductor device described in an embodiment disclosed in this application includes the steps of: forming a semiconductor region by ion-implanting an n type impurity or a p type impurity into a semiconductor substrate of a substrate having the semiconductor substrate, an insulating layer formed on the semiconductor substrate, and a semiconductor layer formed on the insulating layer; and ion-implanting carbon into the semiconductor layer.

A semiconductor device described in an embodiment disclosed in this application includes a field effect transistor formed on a substrate having a semiconductor substrate, an insulating layer formed on the semiconductor substrate, and a semiconductor layer formed on the insulating layer. Also, the semiconductor device further includes a semiconductor region disposed in the semiconductor substrate below a gate electrode of the field effect transistor via the semiconductor layer and the insulating layer, and the semiconductor substrate contains interstitial atoms.

A manufacturing method of a semiconductor device described in an embodiment disclosed in this application includes the steps of: forming a semiconductor region by ion-implanting an n type impurity or a p type impurity into a semiconductor substrate of a substrate having the semiconductor substrate, an insulating layer formed on the semiconductor substrate, and a semiconductor layer formed on the insulating layer; and ion-implanting atoms into the semiconductor substrate, and thereby forming interstitial atoms.

According to a semiconductor device described in the following typical embodiment of the present invention disclosed in this application, it is possible to improve the characteristics of a semiconductor device. According to a manufacturing method of a semiconductor device described in the following typical embodiment of the present invention disclosed in this application, it is possible to improve the characteristics of a semiconductor device.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numbers mentioned above (number of pieces, numerical value, amount and range).

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, when there are a plurality of similar members (parts), individual or specific members may be indicated by adding a sign to a generic symbol in some cases. In addition, the description of the same or similar parts is not repeated in principle unless particularly required in the following embodiments.

Also, in some drawings used in the following embodiments, hatching is omitted even in a sectional view so as to make the drawings easy to see.

Also, in the sectional views, the sizes of the respective parts do not correspond to those of actual devices, and specific parts may be relatively enlarged in some cases so as to make the drawings easy to see.

First Embodiment

[Description of Structure]

Figure 1:
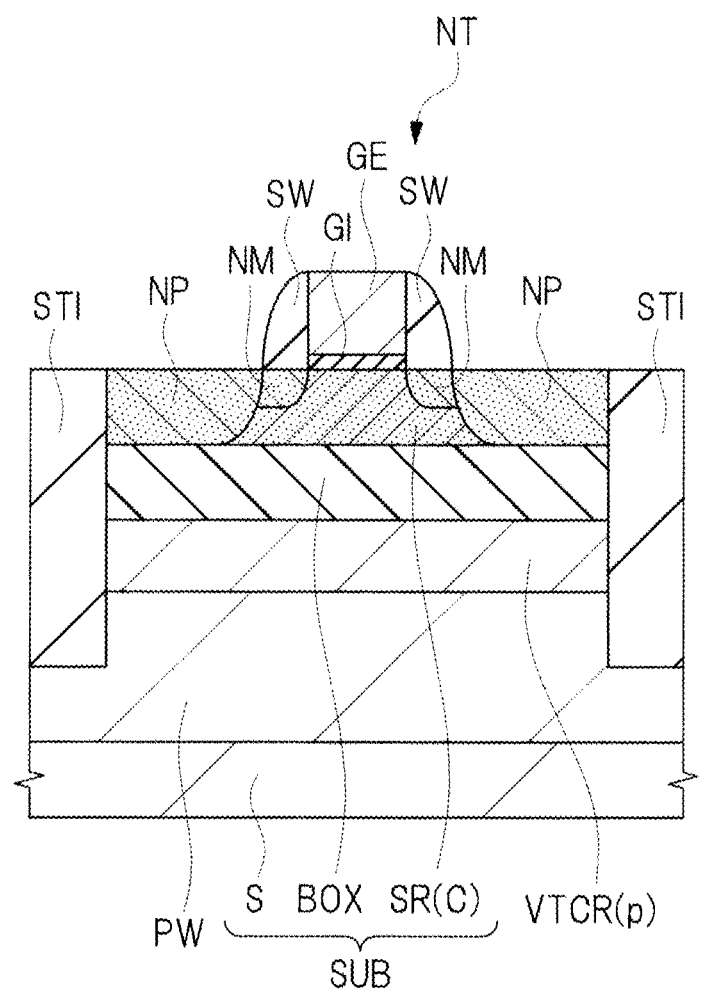
FIG. 1 is a sectional view showing a characteristic structure of a semiconductor device of the first embodiment.

Hereinafter, a semiconductor device of the present embodiment will be described with reference to the drawings. FIG. 1 is a sectional view showing a characteristic structure of a semiconductor device of the present embodiment.

The semiconductor device shown in FIG. 1 has a MISFET (Metal Insulator Field Effect Transistor) formed on an SOI substrate SUB. An n channel MISFET (NT) is shown as an example of the MISFET here, but a p channel MISFET may be formed. Alternatively, both of an n channel MISFET and a p channel MISFET may be formed (see FIG. 2).

The SOI substrate SUB is composed of a support substrate (also referred to as semiconductor substrate) S, an insulating layer (also referred to as buried insulating layer) BOX formed on the support substrate S, and a silicon layer (also referred to as semiconductor layer, semiconductor film, thin semiconductor film, or thin-film semiconductor region) SR formed on the insulating layer BOX. The n channel MISFET (NT) is formed on a main surface of the silicon layer SR.

The support substrate S of the SOI substrate SUB is a semiconductor substrate made of, for example, silicon (Si). Also, the insulating layer BOX is made of, for example, a silicon oxide film. Further, on this insulating layer BOX, for example, the silicon layer SR made of single crystal silicon with a resistance of about 1 to 10 Ωcm is disposed as a semiconductor layer.

The n channel MISFET (NT) is formed on the main surface of the silicon layer SR surrounded by element isolation insulating films STI. A p type well region PW is formed in the support substrate S in a forming region of then channel MISFET (NT).

The n channel MISFET (NT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have n type low-concentration impurity regions NM formed in a self alignment manner with the gate electrode GE and n type high-concentration impurity regions NP formed in a self alignment manner with the assembled part made up of the gate electrode GE and sidewall films SW on side walls thereof. The region between the source and drain regions, that is, the region between the n type low-concentration impurity regions NM on both sides of the gate electrode GE serves as a channel forming region.

Here, in the present embodiment, a p type impurity region VTCR(p) for threshold adjustment is formed in the support substrate S below the insulating layer BOX. Also, in the present embodiment, carbon (C) is contained in the silicon layer SR. Therefore, in FIG. 1, the silicon layer containing carbon (C) is represented as "SR(C)".

As described above, in the present embodiment, by forming the n channel MISFET (NT) on the main surface of the silicon layer SR(C) containing carbon (C), the characteristics of the MISFET can be improved. The details thereof will be described later (see FIG. 16).

Figure 2:
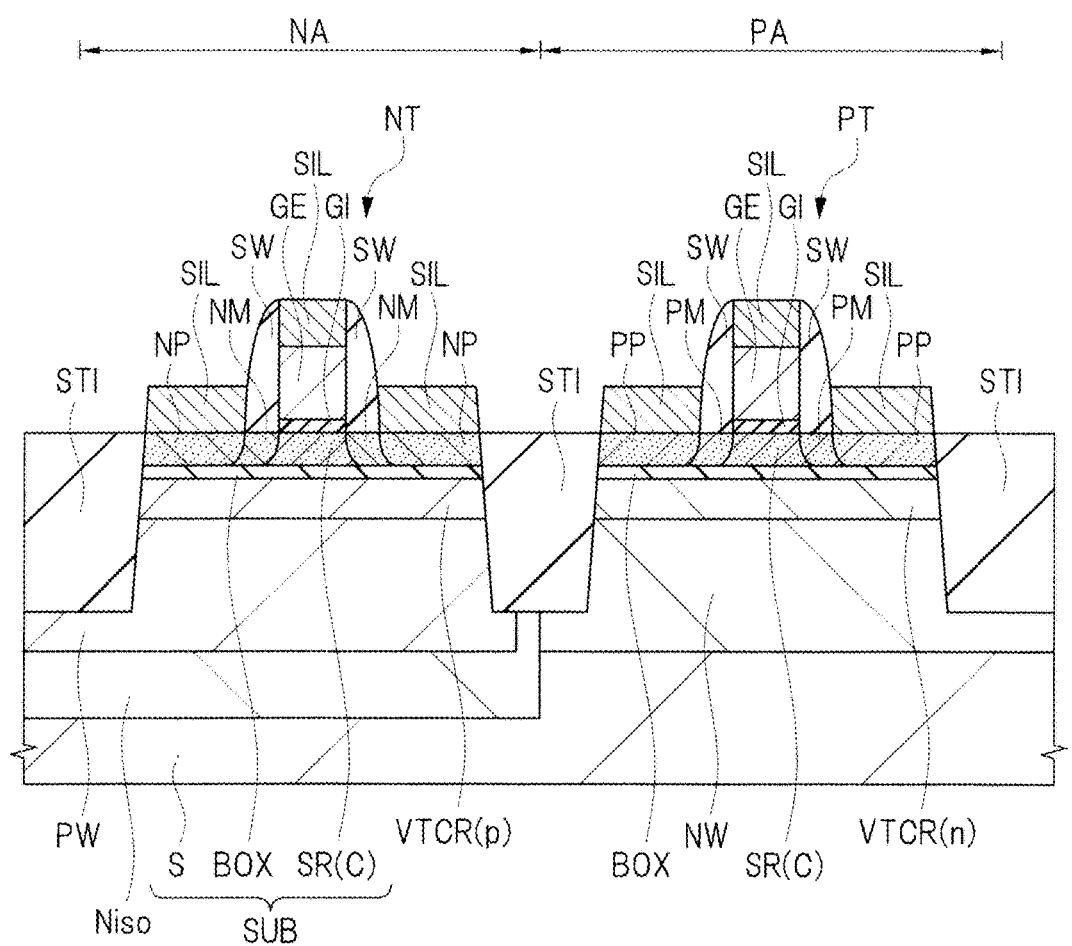
FIG. 2 is a sectional view showing another structure of the semiconductor device of the first embodiment.

FIG. 2 is a sectional view showing another structure of the semiconductor device of the present embodiment. In FIG. 1, the n channel MISFET (NT) is shown as an example. As described above, however, both of an n channel MISFET and a p channel MISFET may be formed.

The semiconductor device shown in FIG. 2 is a semiconductor device having an n channel MISFET (NT) and a p channel MISFET (PT) formed on the SOI substrate SUB. The n channel MISFET (NT) is formed in an nMIS forming region NA, and the p channel MISFET (PT) is formed in a pMIS forming region PA.

The SOI substrate SUB has the support substrate S, the insulating layer BOX formed thereon, and the silicon layer SR formed thereon. The nMIS forming region NA and the pMIS forming region PA are demarcated by the element isolation insulating films STI, respectively.

The n channel MISFET (NT) is formed on the main surface of the silicon layer SR in the nMIS forming region NA. The n channel MISFET (NT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have n type low-concentration impurity regions NM formed in a self alignment manner with the gate electrode GE and n type high-concentration impurity regions NP formed in a self alignment manner with the assembled part made up of the gate electrode GE and sidewall films SW on side walls thereof. The impurity concentration of the n type high-concentration impurity region NP is higher than that of the n type low-concentration impurity region NM. The region between the source and drain regions, that is, the region between the n type low-concentration impurity regions NM on both sides of the gate electrode GE serves as a channel forming region.

Figure 15:
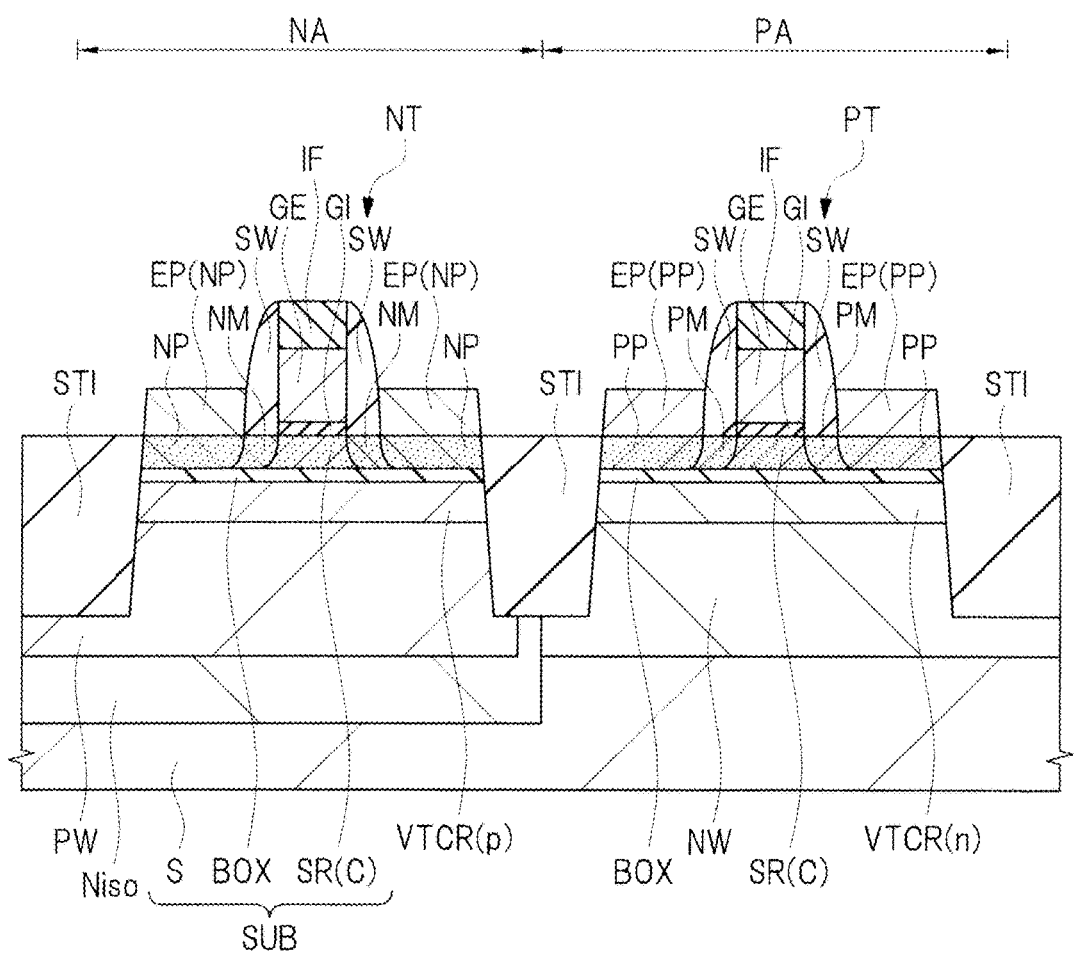
FIG. 15 is a sectional view showing the manufacturing process of the semiconductor device of the first embodiment continued from FIG. 14.

In the present embodiment, an epitaxial layer EP is formed on the silicon layers SR on both sides of the assembled part made up of the gate electrode GE and sidewall films SW on side walls thereof, and each of the n type high-concentration impurity regions NP is composed of the epitaxial layer EP containing an n type impurity (for example, phosphorus (P) or arsenic (As)) and the silicon layer SR (see FIG. 15). Thereafter, the epitaxial layer EP is silicided to forma metal silicide layer SIL. The n type high-concentration impurity region NP may be made of only the epitaxial layer EP containing an n type impurity. In this case, only the n type low-concentration impurity region NM is formed in the silicon layer SR. Alternatively, only a surface part of the epitaxial layer EP may be silicided to form the metal silicide layer SIL. In this case, the epitaxial layer EP containing an n type high-concentration impurity is left below the metal silicide layer SIL.

Further, in the support substrate S of the nMIS forming region NA, an n type semiconductor region Niso and the p type well region PW are formed. The n type semiconductor region Niso is formed more deeply than the p type well region PW so as to surround the p type well region PW.

The p channel MISFET (PT) is formed on the main surface of the silicon layer SR in the pMIS forming region PA. The p channel MISFET (PT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have p type low-concentration impurity regions PM formed in a self alignment manner with the gate electrode GE and p type high-concentration impurity regions PP formed in a self alignment manner with the assembled part made up of the gate electrode GE and sidewall films SW on side walls thereof. The region between the source and drain regions, that is, the region between the p type low-concentration impurity regions PM on both sides of the gate electrode GE serves as a channel forming region.

In the present embodiment, an epitaxial layer EP is formed on the p type low-concentration impurity regions PM (see FIG. 14), and each of the p type high-concentration impurity regions PP is composed of the epitaxial layer EP containing a p type impurity (for example, boron (B)) and the silicon layer SR (see FIG. 15). Thereafter, the epitaxial layer EP is silicided to form a metal silicide layer SIL. The p type high-concentration impurity region PP may be made of only the epitaxial layer EP containing a p type impurity. In this case, only the p type low-concentration impurity region PM is formed in the silicon layer SR. Alternatively, only a surface part of the epitaxial layer EP may be silicided to form the metal silicide layer SIL. In this case, the epitaxial layer EP containing a p type high-concentration impurity is left below the metal silicide layer SIL.

Also, an n type well region NW is formed in the support substrate S of the pMIS forming region PA.

Here, in the present embodiment, a p type impurity region VTCR(p) for threshold adjustment is formed in the support substrate S below the insulating layer BOX of the nMIS forming region NA, and an n type impurity region VTCR(n) for threshold adjustment is formed in the support substrate S below the insulating layer BOX of the pMIS forming region PA. Also, in the present embodiment, carbon (C) is contained in the silicon layer SR of the nMIS forming region NA and the pMIS forming region PA. Therefore, in FIG. 2, the silicon layer containing carbon (C) is represented as "SR(C)".

As described above, in the present embodiment, by forming the n channel MISFET (NT) and the p channel MISFET (PT) on the main surface of the silicon layer SR(C) containing carbon (C), the characteristics of these MISFETs can be improved. The details thereof will be described later (see FIG. 16).

Although the p type impurity region VTCR(p) is formed for the threshold adjustment of the n channel MISFET (NT) in the present embodiment, an n type impurity region may be formed instead. Also, although the n type impurity region VTCR(n) is formed for the threshold adjustment of the p channel MISFET (PT) in the present embodiment, a p type impurity region may be formed instead.

[Description of Manufacturing Method]

Next, the manufacturing method of the semiconductor device of the present embodiment will be described and the structure of the semiconductor device will be clarified with reference to the drawings. FIG. 3 to FIG. 15 are sectional views showing the manufacturing process of the semiconductor device of the present embodiment.

Figure 3:
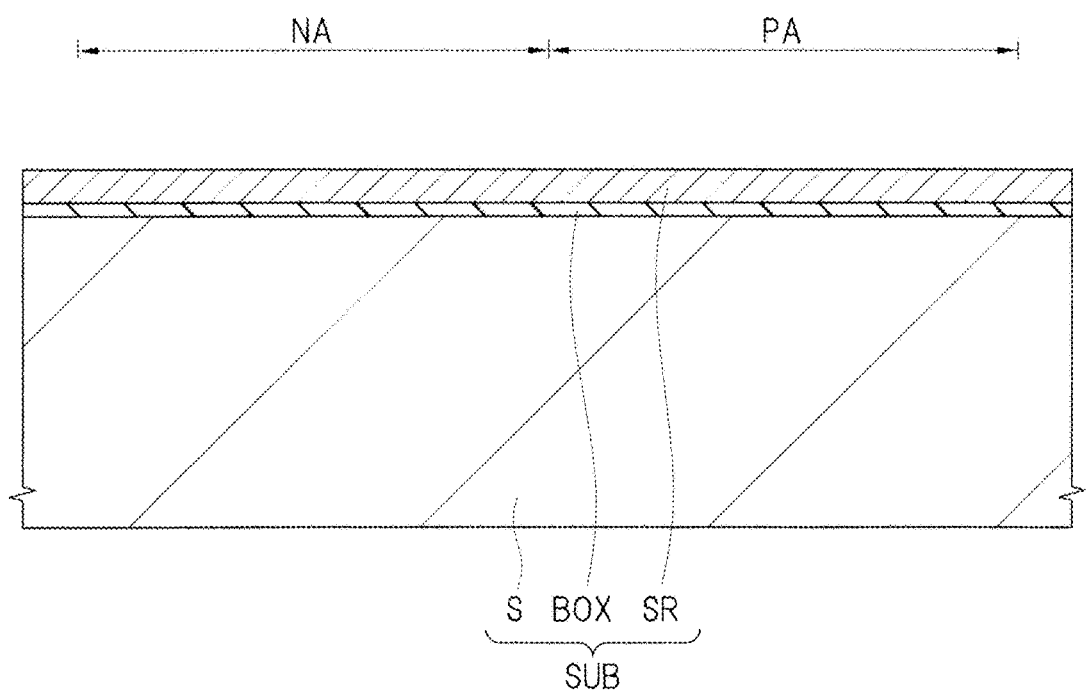
FIG. 3 is a sectional view showing a manufacturing process of the semiconductor device of the first embodiment.

As shown in FIG. 3, for example, an SOI substrate SUB is prepared as a substrate. The SOI substrate SUB is composed of a support substrate (also referred to as semiconductor substrate) S, an insulating layer (also referred to as buried insulating layer) BOX formed on the support substrate S, and a silicon layer (also referred to as semiconductor layer, semiconductor film, thin semiconductor film, or thin-film semiconductor region) SR formed on the insulating layer BOX. The support substrate S is, for example, a p type single crystal silicon substrate. The insulating layer BOX is, for example, a silicon oxide film with a thickness of about 10 to 20 nm. The silicon layer SR is made of, for example, single crystal silicon with a resistance of about 1 to 10 Ωcm and a thickness of about 10 to 20 nm. The SOI substrate SUB has an nMIS forming region NA and a pMIS forming region PA.

The forming method of the SOI substrate SUB is not particularly limited, and the SOI substrate SUB can be formed by, for example, SIMOX (Silicon Implanted Oxide) method. $O_2$ (oxygen) is ion-implanted into the main surface of the semiconductor substrate made of silicon (Si) with high energy, and Si (silicon) and oxygen are then bonded by heat treatment to form the insulating layer BOX at a position slightly deeper than the surface of the semiconductor substrate. In this case, a thin film of the silicon (Si) left on the insulating layer BOX forms the silicon layer SR, and the semiconductor substrate below the insulating layer BOX forms the support substrate S. Alternatively, the SOI substrate SUB may be formed by a laminating method. For example, after a surface of a first semiconductor substrate made of silicon (Si) is oxidized to form an insulating layer BOX, a second semiconductor substrate made of silicon (Si) is laminated thereon by applying pressure under high temperature. Thereafter, the second semiconductor substrate is thinned. In this case, the thin film of the second substrate left on the insulating layer BOX forms the silicon layer SR, and the first semiconductor substrate below the insulating layer BOX forms the support substrate S.

Figure 4:
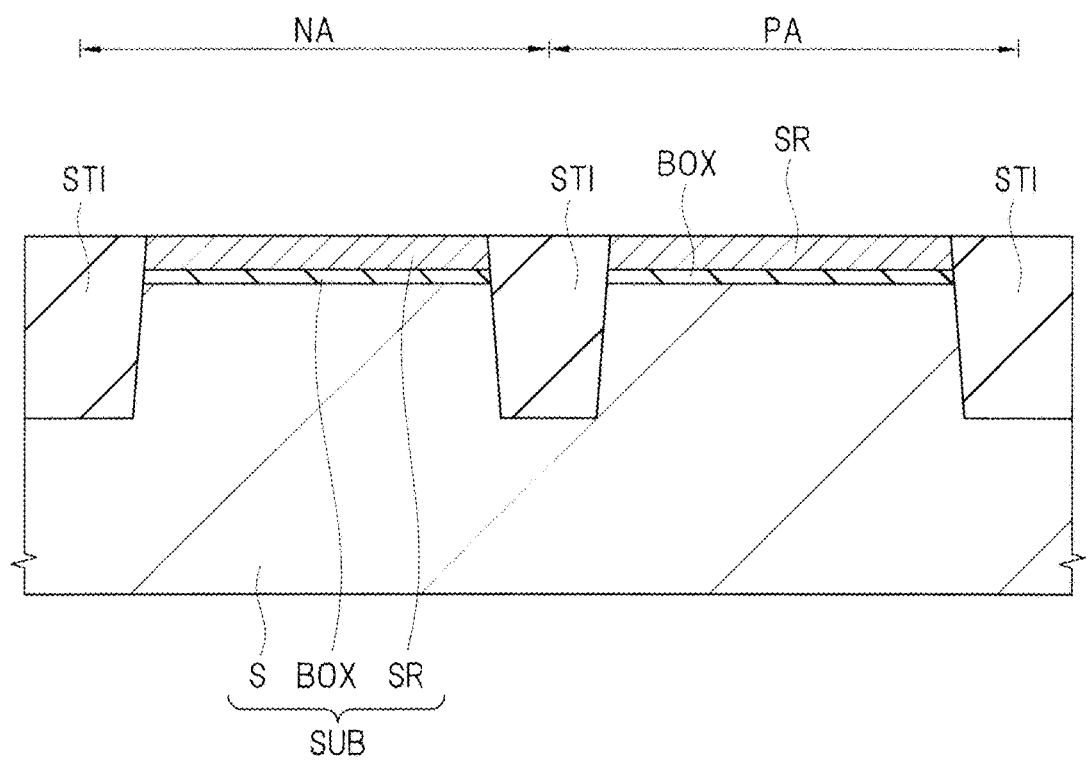
FIG. 4 is a sectional view showing the manufacturing process of the semiconductor device of the first embodiment continued from FIG. 3.

Next, as shown in FIG. 4, the element isolation insulating film STI is formed in the silicon layer SR of the SOI substrate SUB. This element isolation insulating film is formed by using the STI (Shallow Trench Isolation) method. For example, element isolation trenches are formed by etching part of the silicon layer SR, the insulating layer BOX and the support substrate SUB in the forming region of the element isolation insulating film STI. The element isolation trench penetrates through the silicon layer SR and the insulating layer BOX to reach the middle of the support substrate S.

Subsequently, on the SOI substrate SUB including the element isolation trenches, a silicon oxide film is deposited as an insulating film so as to have a thickness capable of filling the element isolation trenches by the CVD method or the like. Then, the silicon oxide film in the region other than the element isolation trenches is removed by CMP (Chemical Mechanical Polishing) method, the etch back method or the like. In this manner, the element isolation insulating films STI in which the silicon oxide film (insulating film) is buried in the element isolation trenches can be formed. Here, the element isolation insulating films STI are formed in order to prevent the interferences between respective elements, that is, the n channel MISFET (NT) and the p channel MISFET (PT).

Figure 5:
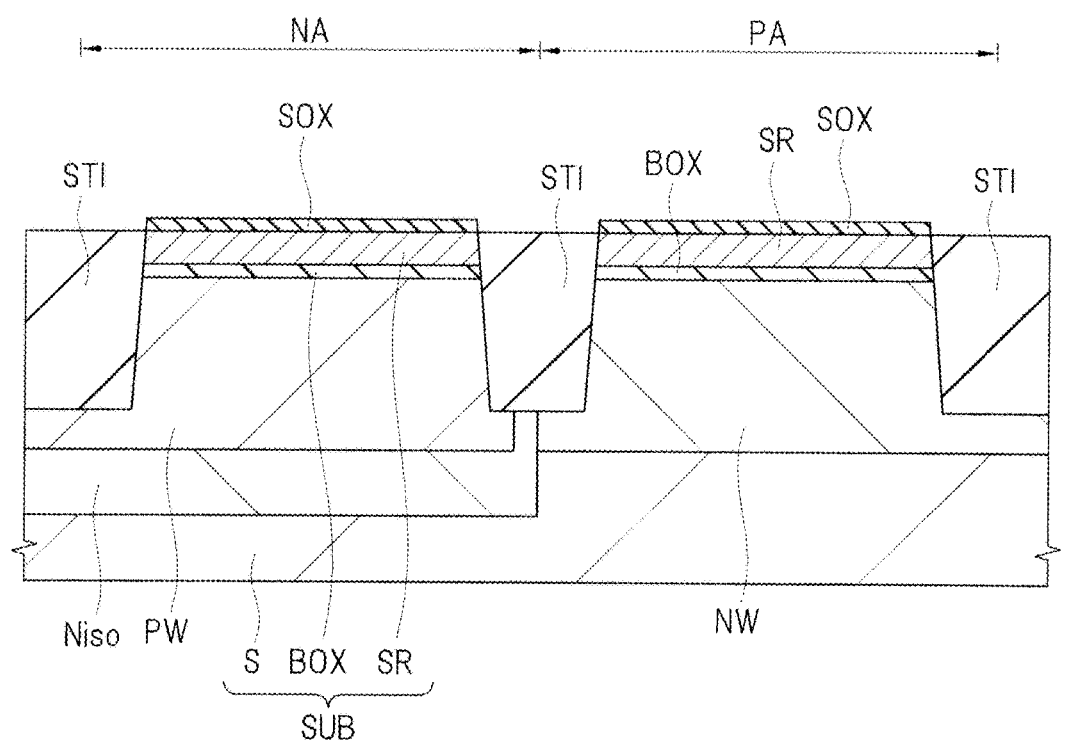
FIG. 5 is a sectional view showing the manufacturing process of the semiconductor device of the first embodiment continued from FIG. 4.

Subsequently, as shown in FIG. 5, impurity ions are implanted into the silicon layer SR to form the n type semiconductor region Niso and the p type well region PW in the nMIS forming region NA and form the n type well region NW in the pMIS forming region PA.

For example, as shown in FIG. 5, as a sacrificial oxide film (also referred to as through oxide film), a silicon oxide film SOX is formed by thermally oxidizing the surface of the silicon layer SR. Then, by forming a photoresist film (not shown) on the SOI substrate SUB and performing the exposure and development process, a photoresist film (not shown) having an opening for the nMIS forming region NA is formed. Next, an n type impurity is ion-implanted into the support substrate S with the photoresist mask used as a mask, and thereby forming the n type semiconductor region Niso. A bottom part of the n type semiconductor region Niso is deeper than the bottom part of the insulating layer BOX and is disposed at a relatively deep position of the support substrate S.

Subsequently, a p type impurity (for example, boron) is ion-implanted into the support substrate S with the photoresist film mentioned above used as a mask, and thereby forming the p type well region PW. A bottom part of the p type well region PW is located at a position shallower than the bottom part of the n type semiconductor region Niso, and the n type semiconductor region Niso is disposed so as to surround the p type well region PW. Next, the photoresist film is removed by ashing process or the like.

Subsequently, by forming a photoresist film (not shown) on the SOI substrate SUB and performing the exposure and development process, a photoresist film (not shown) having an opening for the pMIS forming region PA is formed. An n type impurity is ion-implanted into the support substrate S with the photoresist film mentioned above used as a mask, and thereby forming the n type well region NW. Next, the photoresist film is removed by ashing process or the like.

Next, as shown in FIG. 6 to FIG. 9, carbon (C) is ion-implanted into the silicon layer SR, the p type impurity region VTCR(p) is formed, and the n type impurity region VTCR(n) is formed.

Figure 6:
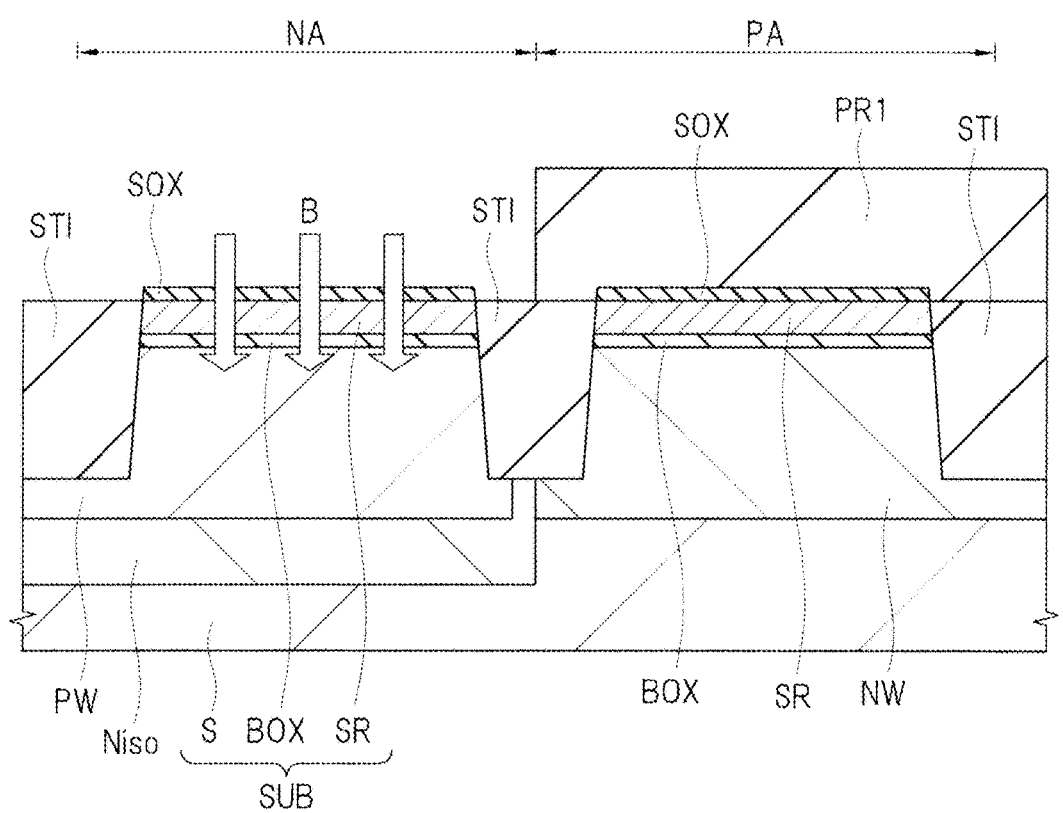
FIG. 6 is a sectional view showing the manufacturing process of the semiconductor device of the first embodiment continued from FIG. 5.

For example, as shown in FIG. 6, a photoresist film PRT having an opening for the nMIS forming region NA is formed, and a p type impurity (for example, boron (B)) is ion-implanted into the support substrate S below the insulating layer BOX with the photoresist film PRT used as a mask. In this manner, the p type impurity region VTCR(p) for threshold adjustment is formed (see FIG. 7).

Figure 7:
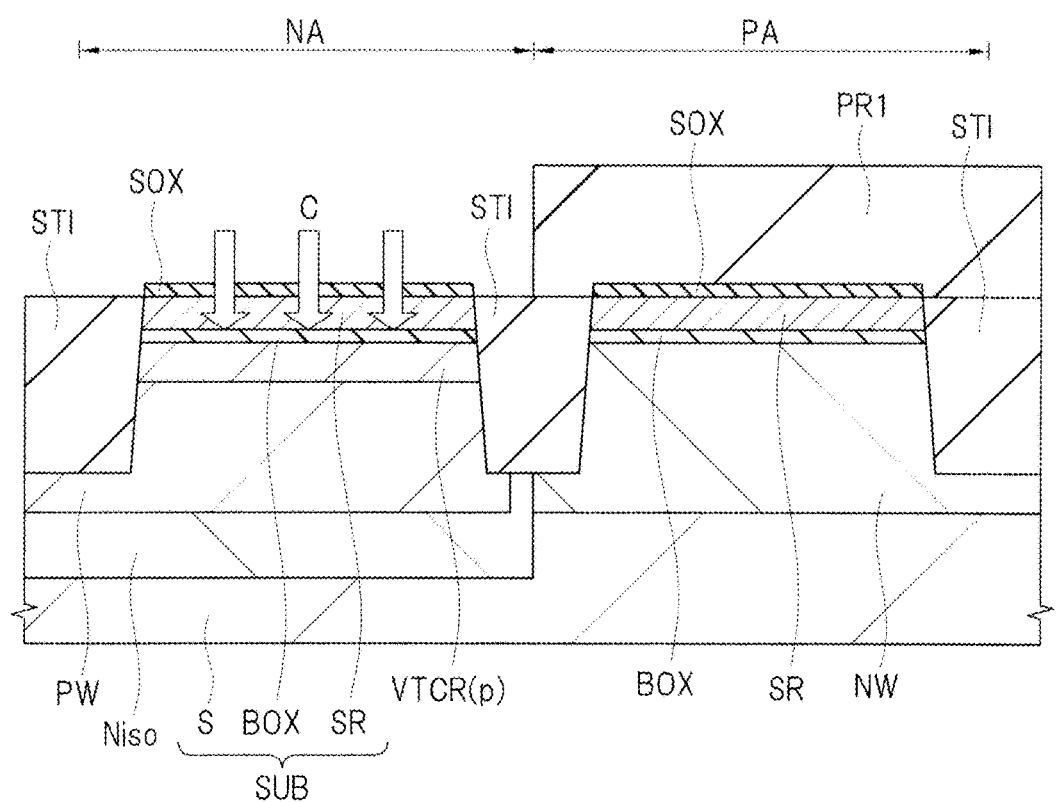
FIG. 7 is a sectional view showing the manufacturing process of the semiconductor device of the first embodiment continued from FIG. 6.

Subsequently, as shown in FIG. 7, carbon (C) is ion-implanted into the silicon layer SR with the photoresist film PRT used as a mask. The silicon layer SR after the implantation of carbon is denoted by "SR(C)" (see FIG. 8). Thereafter, the photoresist film PRT is removed by the ashing process or the like.

Figure 8:
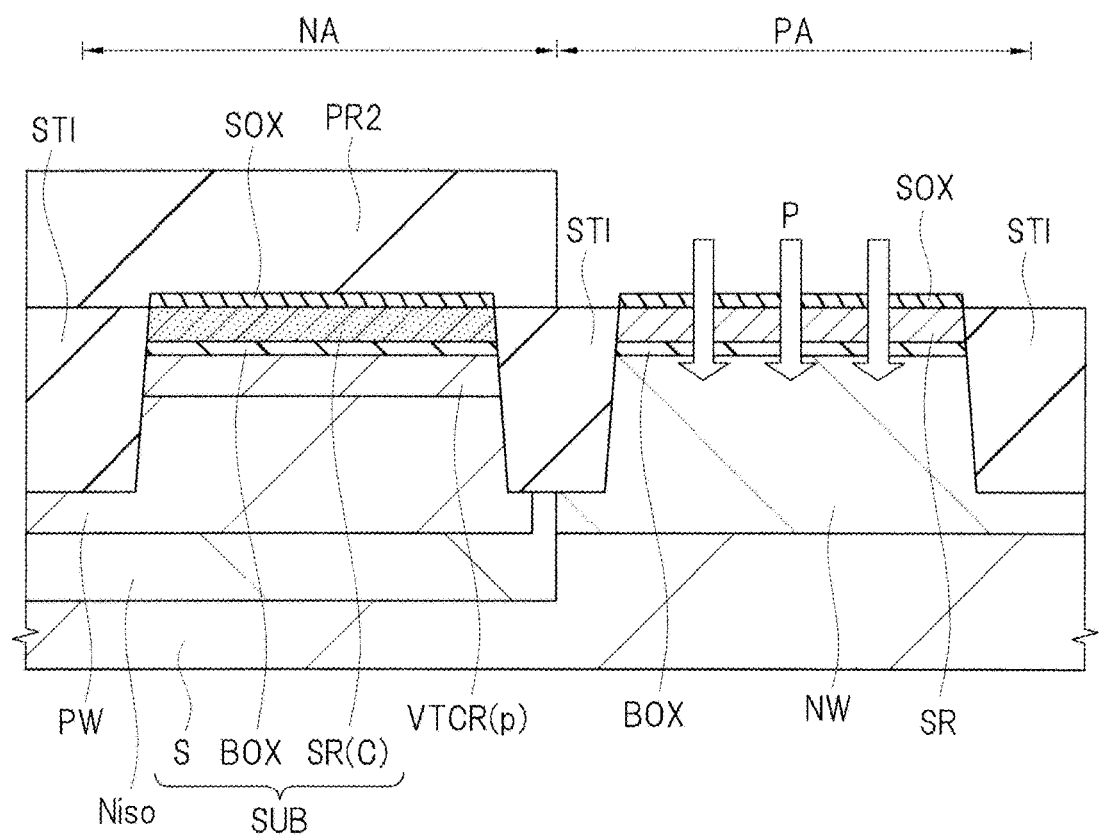
FIG. 8 is a sectional view showing the manufacturing process of the semiconductor device of the first embodiment continued from FIG. 7.

Subsequently, as shown in FIG. 8, a photoresist film PR2 having an opening for the pMIS forming region PA is formed, and an n type impurity (for example, phosphorus (P)) is ion-implanted into the support substrate S below the insulating layer BOX with the photoresist film PR2 used as a mask. In this manner, the n type impurity region VTCR(n) for threshold adjustment is formed (see FIG. 9).

Figure 9:
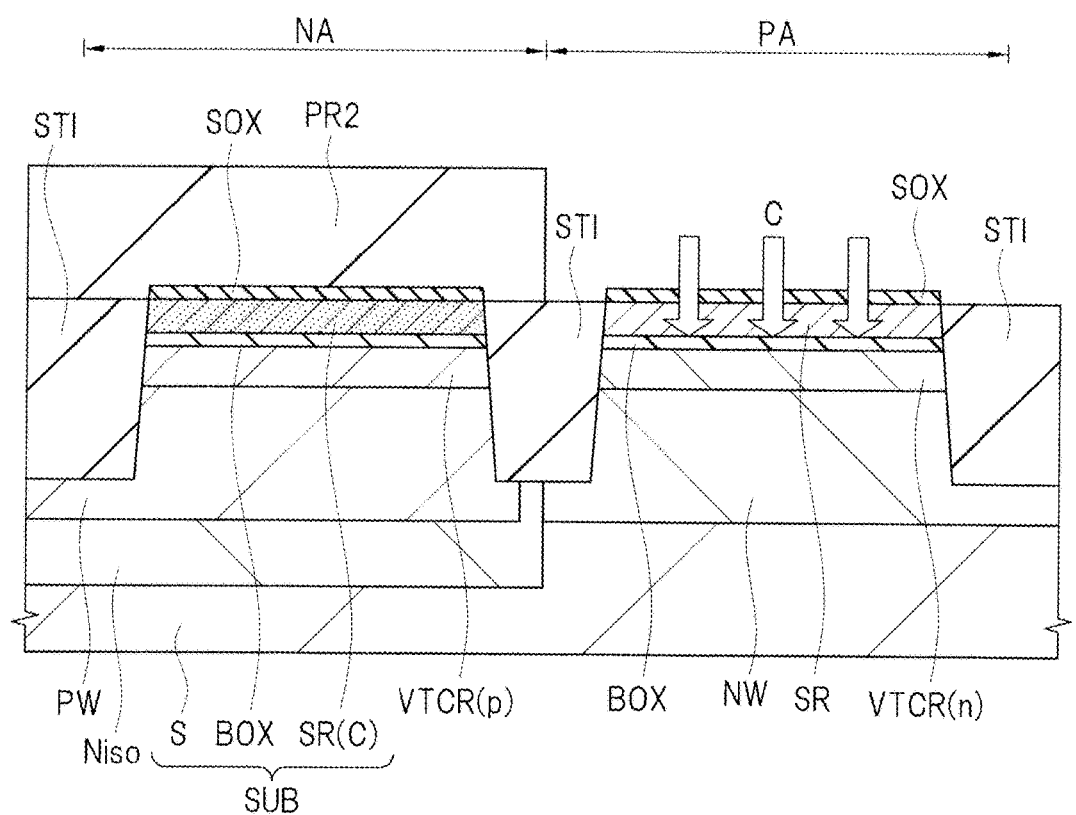
FIG. 9 is a sectional view showing the manufacturing process of the semiconductor device of the first embodiment continued from FIG. 8.

Subsequently, as shown in FIG. 9, carbon (C) is ion-implanted into the silicon layer SR with the photoresist film PR2 used as a mask. The silicon layer SR after the implantation of carbon is denoted by "SR(C)". Thereafter, the photoresist film PR2 is removed by the ashing process or the like (see FIG. 10).

Alternatively, the p type impurity region VTCR(p) may be formed after the ion implantation of carbon (C). Also, the n type impurity region VTCR(n) may be formed after the ion implantation of carbon (C). Further, the photoresist film for forming the n type semiconductor region Niso, the p type well region PW and the n type well region NW may be used for the ion implantation of carbon (C), the formation of the p type impurity region VTCR(p) or the formation of the n type impurity region VTCR(n).

Thereafter, by performing the heat treatment, the n type impurity (for example, phosphorus (P)) in the n type impurity region VTCR(n) and the p type impurity (for example, boron (B)) in the p type impurity region VTCR(p) are activated.

Here, by the heat treatment described above, the n type impurity (for example, phosphorus (P)) in the n type impurity region VTCR(n) and the p type impurity (for example, boron (B)) in the p type impurity region VTCR(p) are diffused across the insulating layer BOX to reach the silicon layer SR in some cases. Even when the n type impurity or the p type impurity diffused to the silicon layer SR is present like this, the impurity is inactivated (electrically inactivated) by the carbon (C) implanted into the silicon layer SR. Therefore, the silicon layer SR to be the channel forming region of the MISFET (NT, PT) becomes a substantially non-dope state, and the fluctuation of the transistor characteristics, for example, the fluctuation of the threshold voltage of the MISFET (NT, PT) can be reduced.

Figure 10:
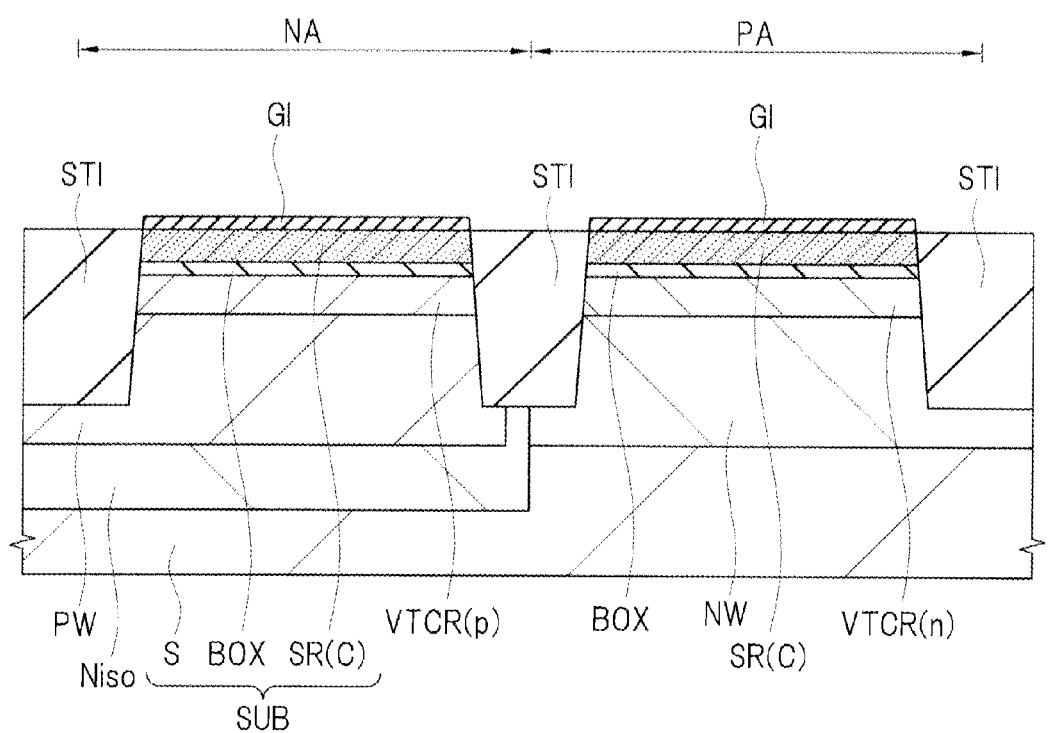
FIG. 10 is a sectional view showing the manufacturing process of the semiconductor device of the first embodiment continued from FIG. 9.

Subsequently, as shown in FIG. 10, the gate insulating film GI for the MISFET (NT, PT) is formed. For example, by removing the silicon oxide film SOX by etching and thermally oxidizing the surface of the silicon layer SR(C) exposed from the nMIS forming region NA and the pMIS forming region PA, the gate insulating film GI made of the silicon oxide film (or thermally oxidized film) is formed. This gate insulating film GI may be formed by depositing a silicon oxide film by the CVD method or the like. Alternatively, a silicon oxynitride film may be used instead of a silicon oxide film. Also, a high dielectric constant film (high-k film) may be used as the gate insulating film GI.

Figure 11:
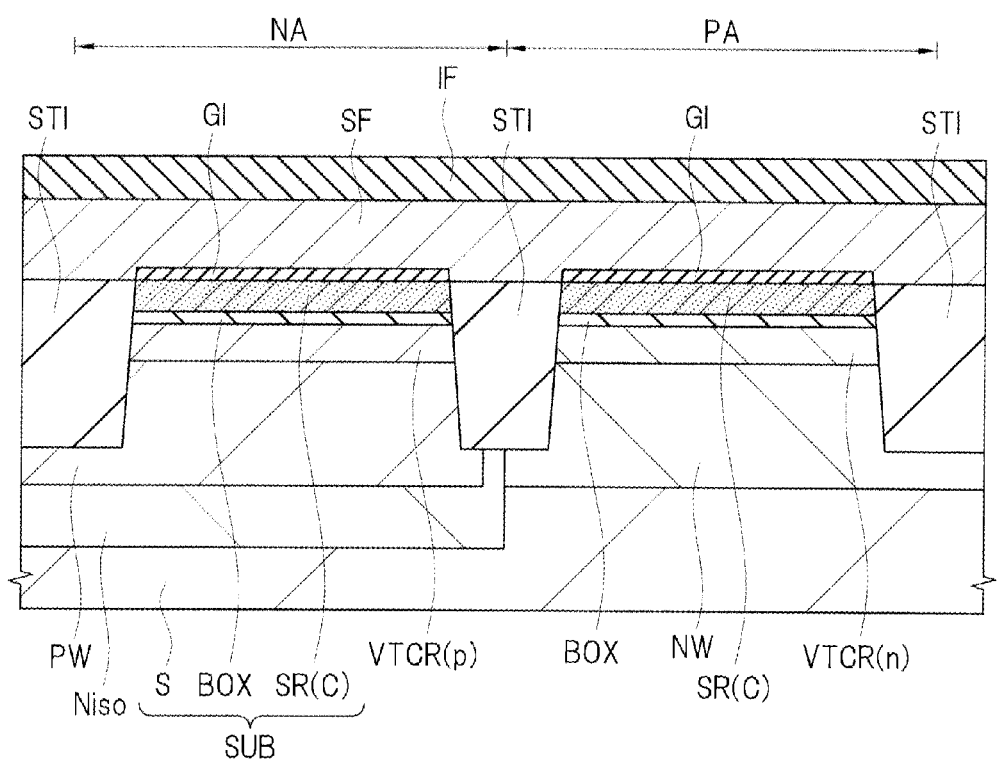
FIG. 11 is a sectional view showing the manufacturing process of the semiconductor device of the first embodiment continued from FIG. 10.

Subsequently, as shown in FIG. 11, a polycrystalline silicon film SF is formed as a conductive film on the SOI substrate SUB by using the CVD method or the like. Then, on the polycrystalline silicon film SF, an insulating film (for example, silicon nitride film) IF is formed by using the CVD method or the like.

Figure 12:
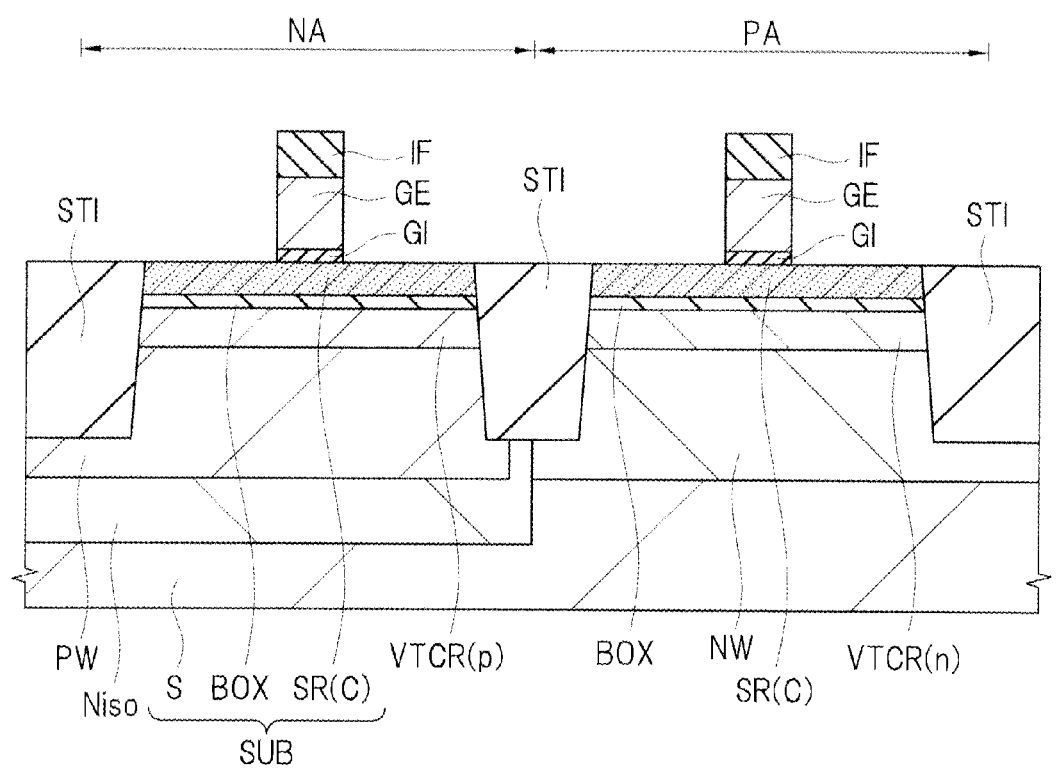
FIG. 12 is a sectional view showing the manufacturing process of the semiconductor device of the first embodiment continued from FIG. 11.

Subsequently, as shown in FIG. 12, the gate electrode GE is formed. For example, by forming a photoresist film (not shown) on the insulating film IF and performing the exposure and development process, the photoresist film in the region other than the forming region of the gate electrode GE is removed. Then, the insulating film IF is etched with the photoresist film used as a mask. Thereafter, the photoresist film is removed by ashing process or the like, and the polycrystalline silicon film SF is etched with the insulating film IF used as a mask. In this manner, the gate electrode GE is formed in each of the nMIS forming region NA and the pMIS forming region PA. At this time, in each of the regions (NA, PA), the gate insulating film GI exposed from both sides of the gate electrode GE may be removed.

Figure 13:
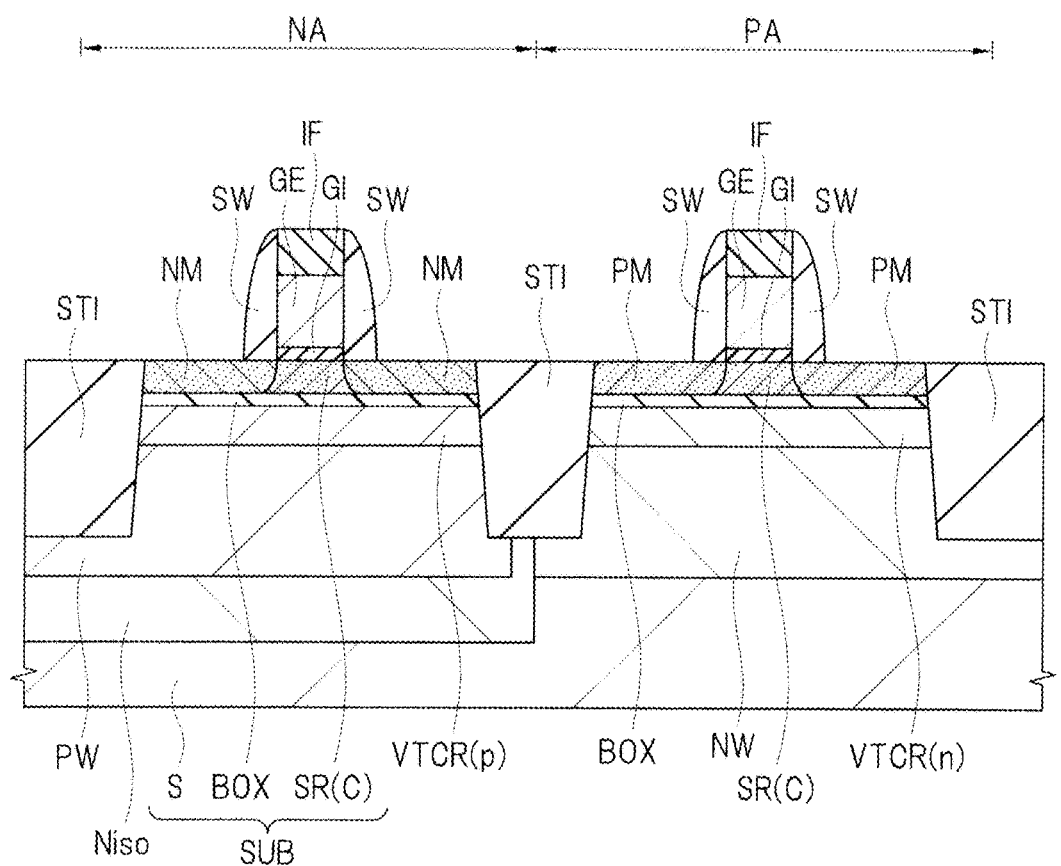
FIG. 13 is a sectional view showing the manufacturing process of the semiconductor device of the first embodiment continued from FIG. 12.
Figure 14:
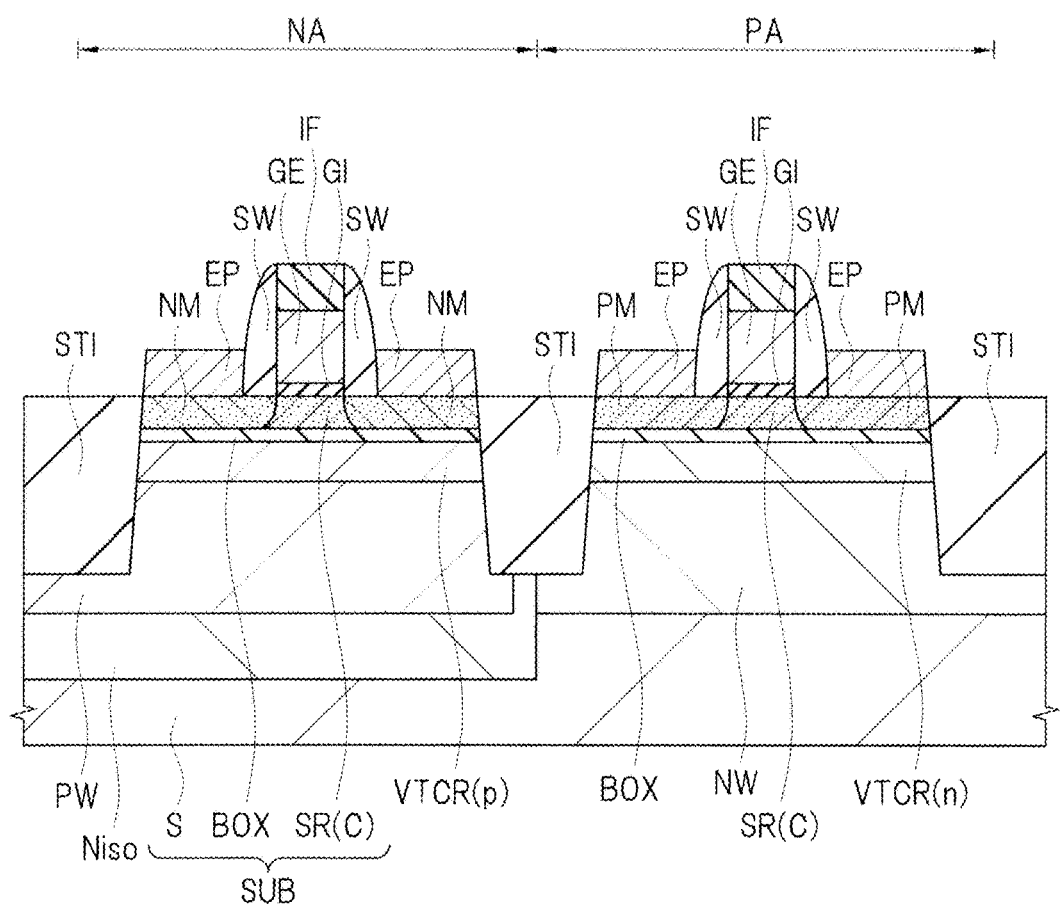
FIG. 14 is a sectional view showing the manufacturing process of the semiconductor device of the first embodiment continued from FIG. 13.

Subsequently, as shown in FIG. 13 to FIG. 15, source and drain regions of the LDD structure are formed in the silicon layer SR on both sides of the gate electrode GE.

For example, as shown in FIG. 13, n type low-concentration impurity regions NM are formed in the silicon layer SR on both sides of the gate electrode GE in the nMIS forming region NA. For example, the n type low-concentration impurity regions NM are formed by introducing an n type impurity into the silicon layer SR by the ion implantation method using the photoresist film (not shown) having an opening for the nMIS forming region NA and the gate electrode GE (including insulating film IF thereon) as masks. Also, the p type low-concentration impurity regions PM are formed in the silicon layer SR on both sides of the gate electrode GE in the pMIS forming region PA. For example, the p type low-concentration impurity regions PM are formed by introducing a p type impurity into the silicon layer SR by the ion implantation method using the photoresist film (not shown) having an opening for the pMIS forming region PA and the gate electrode GE (including insulating film IF thereon) as masks.

Subsequently, sidewall films SW are formed on the side walls on both sides of the gate electrode GE. For example, after depositing an insulating film made of a silicon oxide film by the CVD method on the SOI substrate SUB including the gate electrode GE, the anisotropic etching is performed to leave the insulating film on the side walls of the gate electrode GE as the sidewall films SW.

Subsequently, as shown in FIG. 14, on the silicon layer SR exposed from both sides of the assembled part made up of the gate electrode GE and the sidewall films SW, that is, on the n type low-concentration impurity regions NM and the p type low-concentration impurity regions PM, epitaxial layers EP are formed by using the epitaxial growth method.

Subsequently, as shown in FIG. 15, n type high-concentration impurity regions NP and p type high-concentration impurity regions PP are formed.

For example, by forming a photoresist film (not shown) having an opening for the nMIS forming region NA and introducing an n type impurity into the nMIS forming region NA by the ion implantation method using the assembled part made up of the gate electrode GE (including insulating film IF thereon) and the sidewall films SW as a mask, the n type high-concentration impurity regions NP are formed. Then, by forming a photoresist film (not shown) having an opening for the pMIS forming region PA and introducing a p type impurity into the pMIS forming region PA by the ion implantation method using the assembled part made up of the gate electrode GE (including insulating film IF thereon) and the sidewall films SW as a mask, the p type high-concentration impurity regions PP are formed.

By the process described above, the n channel MISFET (NT) having the source and drain regions of the LDD structure composed of the n type low-concentration impurity regions NM and the n type high-concentration impurity regions NP can be formed. Also, the p channel MISFET (PT) having the source and drain regions of the LDD structure composed of the p type low-concentration impurity regions PM and the p type high-concentration impurity regions PP can be formed.

As described above, in the present embodiment, the threshold value of the n channel MISFET (NT) can be adjusted by forming the p type impurity region VTCR(p) in the support substrate S below the insulating layer BOX in the nMIS forming region NA. Also, the threshold value of the p channel MISFET (PT) can be adjusted by forming the n type impurity region VTCR(n) in the support substrate S below the insulating layer BOX in the pMIS forming region PA.

In addition, even when an impurity is diffused to the silicon layer SR from the p type impurity region VTCR(p) or the n type impurity region VTCR(n) serving as the impurity region for threshold adjustment, the deterioration of the characteristics of the MISFET (NT, PT) can be reduced.

Figure 16A:
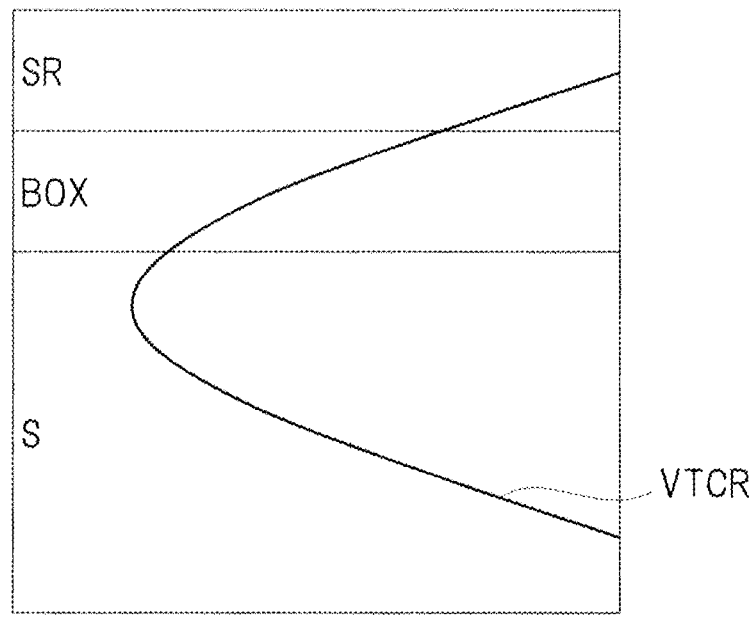
FIG. 16A is a graph showing an impurity concentration in an impurity region for threshold adjustment and a carbon concentration.

FIG. 16 is a graph showing an impurity concentration in the impurity region VTCR for threshold adjustment and a carbon concentration. The vertical axis represents a depth of the SOI substrate, and the horizontal axis represents the concentration of an impurity of carbon. As shown in FIG. 16A, in the state where the support substrate S, the insulating layer BOX and the silicon layer SR are sequentially deposited in this order from the lower side of the SOI substrate, the impurity concentration of the impurity region VTCR reaches its peak in the support substrate S just below the insulating layer BOX as shown by the graph (VTCR). Then, the concentration is lowered as moving toward the surface side from the peak position to the insulating layer BOX and the silicon layer SR. In particular, the tail of the graph of the impurity concentration reaches the silicon layer SR, and it can be understood that the impurity is diffused to the silicon layer SR.

Figure 16B:
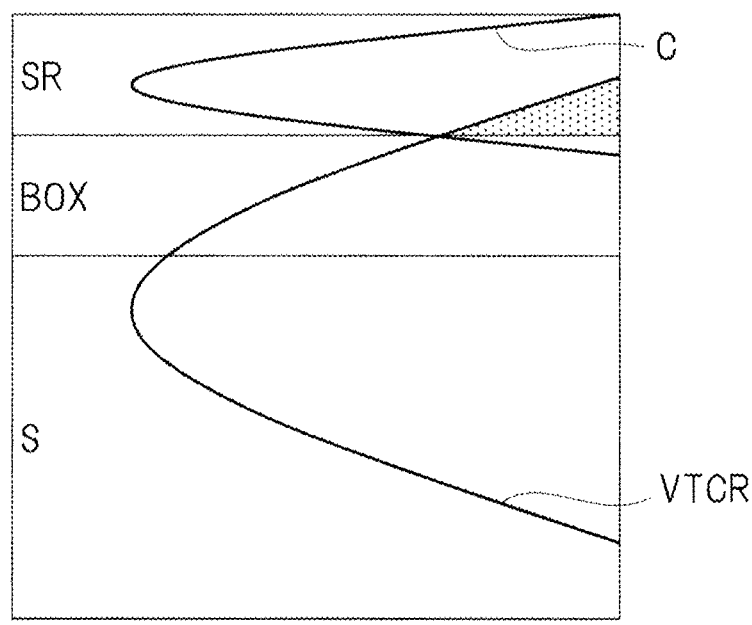
FIG. 16B is a graph showing an impurity concentration in an impurity region for threshold adjustment and a carbon concentration.

Meanwhile, as shown by the graph in FIG. 16B, the carbon concentration reaches its peak at the approximate center of the thickness of the silicon layer SR. Therefore, the impurity indicated by the hatched region in the graph of FIG. 16B, that is, the impurity diffused to the silicon layer SR is inactivated by the carbon in the silicon layer SR.

Therefore, the silicon layer SR to be the channel forming region of the MISFET (NT, PT) becomes a substantially non-dope state, and the fluctuation of the transistor characteristics, for example, the fluctuation of the threshold voltage of the MISFET (NT, PT) can be reduced.

In the embodiment described above, after the ion implantation of carbon (C) into the silicon layer SR is performed in the nMIS forming region NA and the pMIS forming region PA, the impurity region VTCR is formed. However, these processes may be performed in reverse order. More specifically, the ion implantation of carbon (C) may be performed after forming the impurity region VTCR.

Also, in the embodiment described above, after the ion implantation of carbon (C) and the formation of the p type impurity region VTCR(p) are performed to the nMIS forming region NA, the ion implantation of carbon (C) and the formation of the n type impurity region VTCR(n) are performed to the pMIS forming region PA. However, these processes may be performed in reverse order. More specifically, the ion implantation of carbon (C) and a p type impurity into the nMIS forming region NA may be performed after the ion implantation of carbon (C) and an n type impurity into the pMIS forming region PA.

Figure 17:
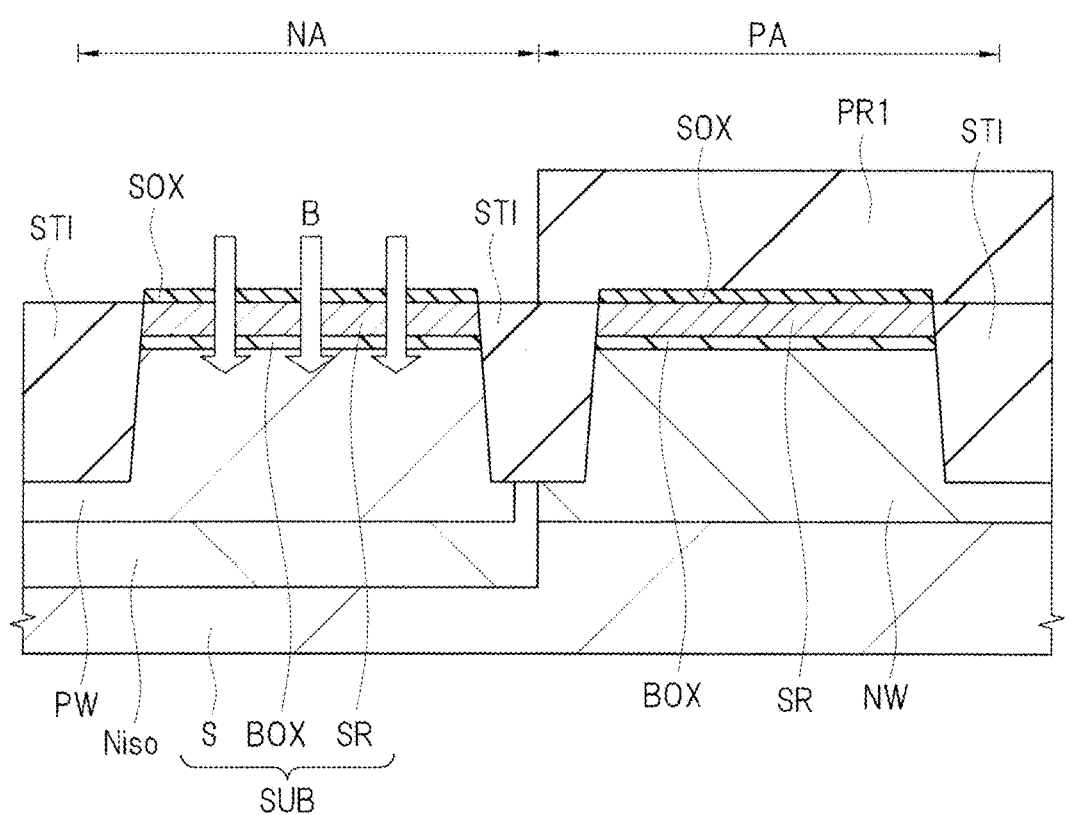
FIG. 17 is a sectional view showing another manufacturing process of the semiconductor device of the first embodiment.
Figure 18:
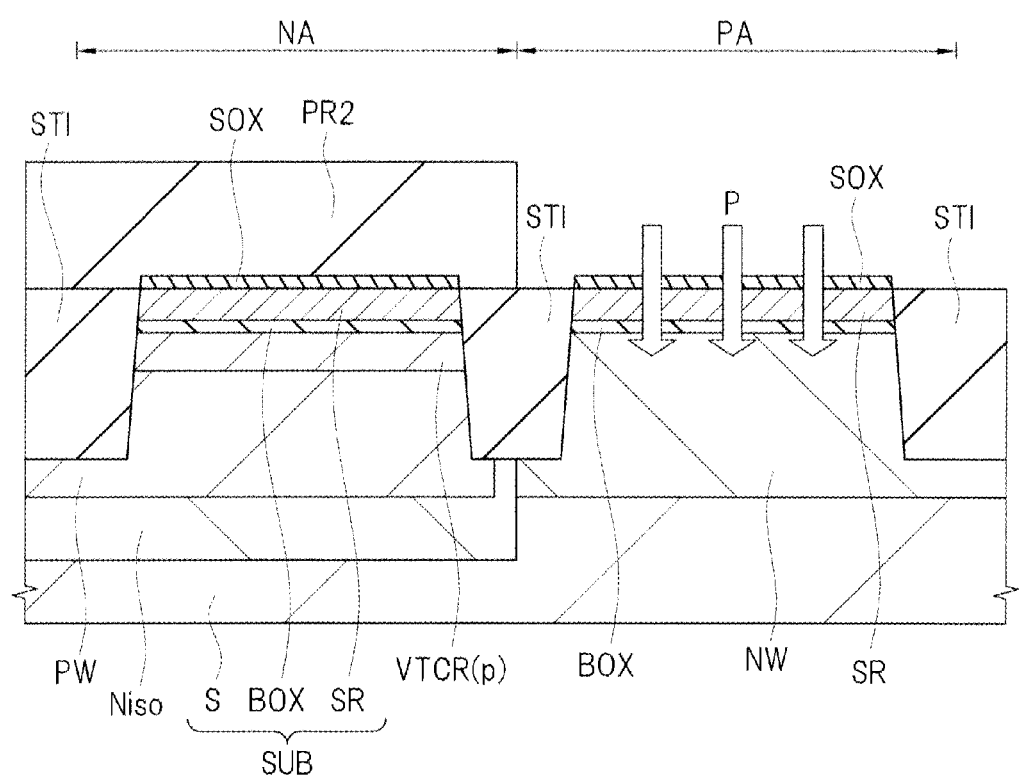
FIG. 18 is a sectional view showing another manufacturing process of the semiconductor device of the first embodiment continued from FIG. 17.
Figure 19:
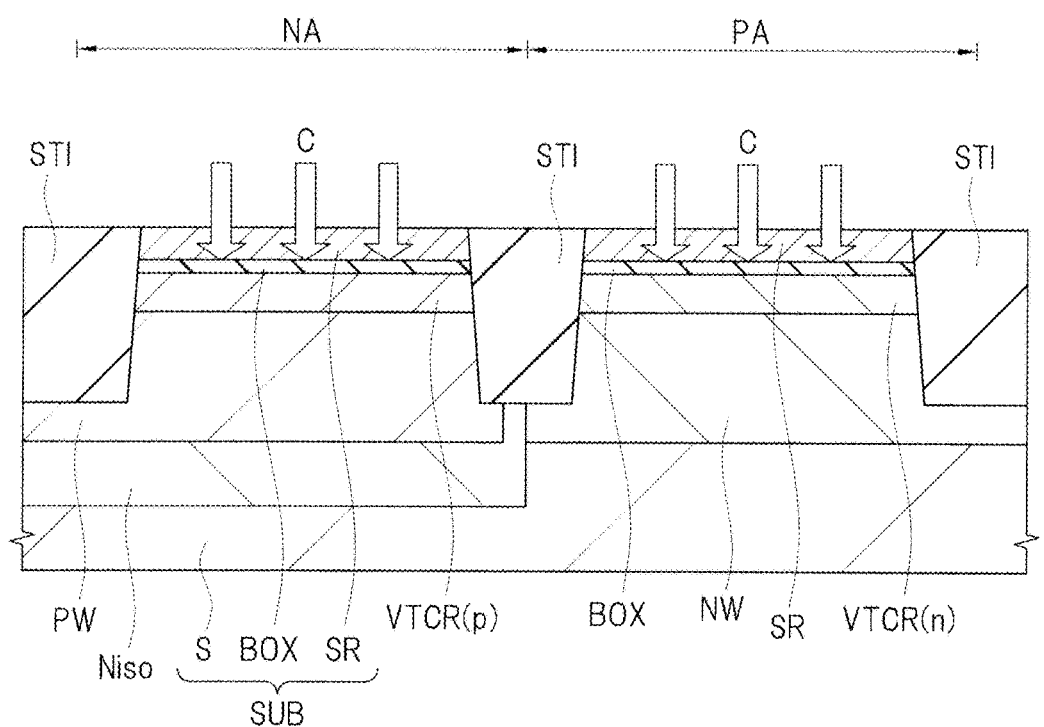
FIG. 19 is a sectional view showing another manufacturing process of the semiconductor device of the first embodiment continued from FIG. 18.

Alternatively, the ion implantation of carbon (C) and the formation of the impurity region VTCR may be performed by the process shown below. FIG. 17 to FIG. 19 are sectional views showing another manufacturing method of the semiconductor device of the present embodiment.

First, the SOI substrate SUB composed of the support substrate S, the insulating layer BOX formed on the support substrate S, and the silicon layer SR formed on the insulating layer BOX is prepared. Then, as described with reference to FIG. 3 to FIG. 5, the element isolation insulating film STI and the silicon oxide film SOX are formed in the SOI substrate SUB, and the n type semiconductor region Niso, the p type well region PW and the n type well region NW are formed.

Subsequently, carbon (C) is ion-implanted into the silicon layer SR, the p type impurity region VTCR(p) is formed, and the n type impurity region VTCR(n) is formed as shown in FIG. 17 to FIG. 19.

For example, as shown in FIG. 17, a photoresist film PR1 having an opening for the nMIS forming region NA is formed, and a p type impurity (for example, boron (B)) is ion-implanted into the support substrate S below the insulating layer BOX with the photoresist film PR1 used as a mask. In this manner, the p type impurity region VTCR(p) for threshold adjustment is formed (see FIG. 18). Thereafter, the photoresist film PR1 is removed by ashing process or the like.

Subsequently, as shown in FIG. 18, a photoresist film PR2 having an opening for the pMIS forming region PA is formed, and an n type impurity (for example, phosphorus (P)) is ion-implanted into the support substrate S below the insulating layer BOX with the photoresist film PR2 used as a mask. In this manner, the n type impurity region VTCR(n) for threshold adjustment is formed (see FIG. 19). Thereafter, the photoresist film PR2 is removed by ashing process or the like.

Next, as shown in FIG. 19, carbon (C) is ion-implanted into the silicon layer SR of the nMIS forming region NA and the pMIS forming region PA.

Thereafter, by performing the heat treatment, the n type impurity (for example, phosphorus (P)) in the n type impurity region VTCR(n) and the p type impurity (for example, boron (B)) in the p type impurity region VTCR(p) are activated.

Also in this process, by the heat treatment described above, then type impurity (for example, phosphorus (P)) in the n type impurity region VTCR(n) and the p type impurity (for example, boron (B)) in the p type impurity region VTCR(p) are diffused across the insulating layer BOX to reach the silicon layer SR in some cases. Even when the n type impurity or the p type impurity diffused to the silicon layer SR is present like this, the impurity is inactivated by the carbon (C) implanted into the silicon layer SR. Therefore, the silicon layer SR to be the channel forming region of the MISFET (NT, PT) becomes a substantially non-dope state, and the fluctuation of the transistor characteristics, for example, the fluctuation of the threshold voltage of the MISFET (NT, PT) can be reduced.

Second Embodiment

[Description of Structure]

Figure 20:
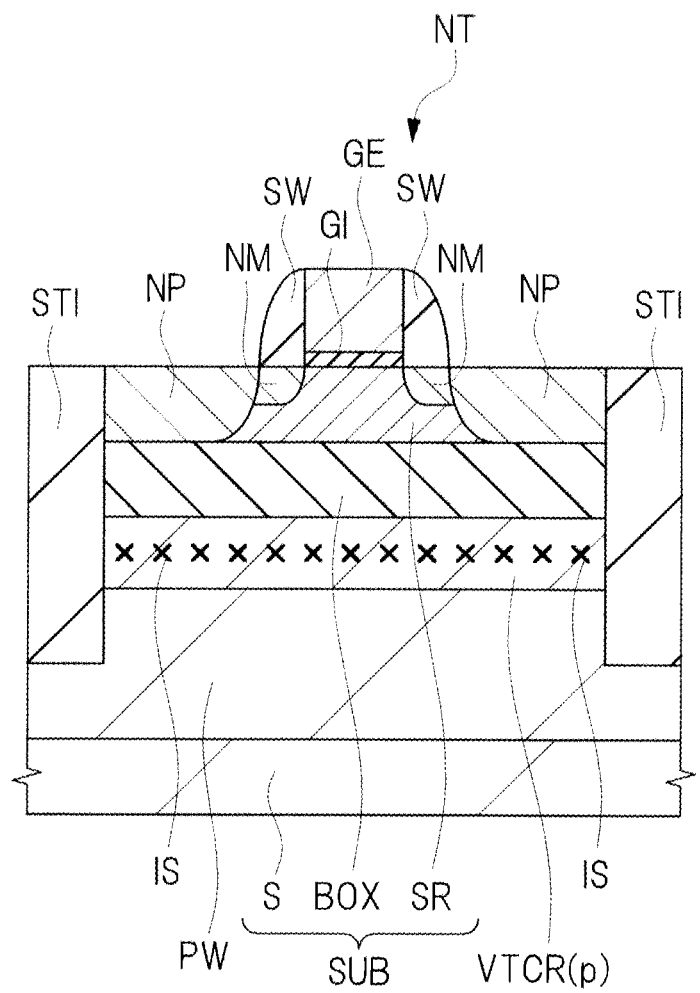
FIG. 20 is a sectional view showing a characteristic structure of a semiconductor device of the second embodiment.

Hereinafter, a semiconductor device of the present embodiment will be described with reference to the drawings. FIG. 20 is a sectional view showing a characteristic structure of a semiconductor device of the present embodiment.

The semiconductor device shown in FIG. 20 has a MISFET formed on an SOI substrate SUB. An n channel MISFET (NT) is shown as an example of the MISFET here, but a p channel MISFET may be formed. Alternatively, both of an n channel MISFET and a p channel MISFET may be formed (see FIG. 21).

The SOI substrate SUB is composed of a support substrate (also referred to as semiconductor substrate) S, an insulating layer (also referred to as buried insulating layer) BOX formed on the support substrate S, and a silicon layer (also referred to as semiconductor layer, semiconductor film, thin semiconductor film, or thin-film semiconductor region) SR formed on the insulating layer BOX. The n channel MISFET (NT) is formed on a main surface of the silicon layer SR.

The support substrate S of the SOI substrate SUB is a semiconductor substrate made of, for example, Si (silicon). Also, the insulating layer BOX is made of, for example, a silicon oxide film. Further, on this insulating layer BOX, for example, the silicon layer SR made of single crystal silicon with a resistance of about 1 to 10 Ωcm is disposed as a semiconductor layer.

The n channel MISFET (NT) is formed on the main surface of the silicon layer SR surrounded by element isolation insulating films STI. A p type well region PW is formed in the support substrate S in a forming region of the n channel MISFET (NT).

The n channel MISFET (NT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have n type low-concentration impurity regions NM formed in a self alignment manner with the gate electrode GE and n type high-concentration impurity regions NP formed in a self alignment manner with the assembled part made up of the gate electrode GE and sidewall films SW on side walls thereof. The region between the source and drain regions, that is, the region between the n type low-concentration impurity regions NM on both sides of the gate electrode GE serves as a channel forming region.

In the present embodiment, interstitial Si (also referred to as interstitial atoms) IS is contained in the support substrate S below the insulating layer BOX, in this case, in the p type impurity region VTCR(p). In FIG. 20, the interstitial Si (IS) is schematically represented by x.

As described above, in the present embodiment, enhanced diffusion of a p type impurity occurs by the interstitial Si (IS) in the p type impurity region VTCR(p) below the insulating layer BOX, and the impurity concentration of the p type impurity is increased in the vicinity of the interstitial Si (IS). Therefore, the diffusion of the p type impurity to the silicon layer SR can be suppressed, and the fluctuation of the transistor characteristics, for example, the fluctuation of the threshold voltage of the MISFET (NT, PT) can be reduced. The details thereof will be described later (see FIG. 30).

Figure 21:
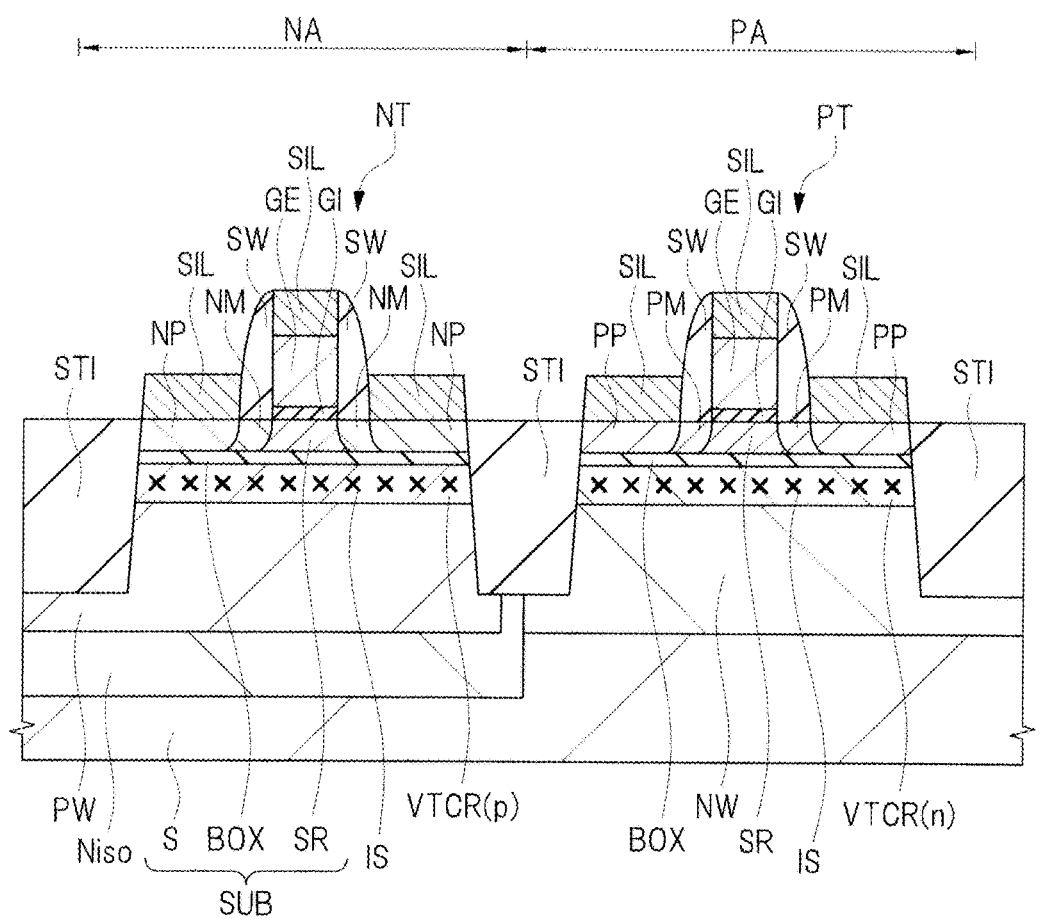
FIG. 21 is a sectional view showing another structure of the semiconductor device of the second embodiment.

FIG. 21 is a sectional view showing another structure of the semiconductor device of the present embodiment. In FIG. 20, an n channel MISFET (NT) is shown as an example, but both of an n channel MISFET and a p channel MISFET may be formed.

The semiconductor device shown in FIG. 21 is a semiconductor device having an n channel MISFET (NT) and a p channel MISFET (PT) formed on an SOI substrate SUB. The n channel MISFET (NT) is formed in an nMIS forming region NA and the p channel MISFET (PT) is formed in a pMIS forming region PA.

The SOI substrate SUB has the support substrate S, the insulating layer BOX formed thereon, and the silicon layer SR formed thereon. The nMIS forming region NA and the pMIS forming region PA are demarcated by the element isolation insulating films STI, respectively.

The n channel MISFET (NT) is formed on the main surface of the silicon layer SR in the nMIS forming region NA. The n channel MISFET (NT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have n type low-concentration impurity regions NM formed in a self alignment manner with the gate electrode GE and n type high-concentration impurity regions NP formed in a self-alignment manner with the assembled part made up of the gate electrode GE and sidewall films SW on side walls thereof. The impurity concentration of the n type high-concentration impurity region NP is higher than that of the n type low-concentration impurity region NM. The region between the source and drain regions, that is, the region between the n type low-concentration impurity regions NM on both sides of the gate electrode GE serves as a channel forming region.

Figure 29:
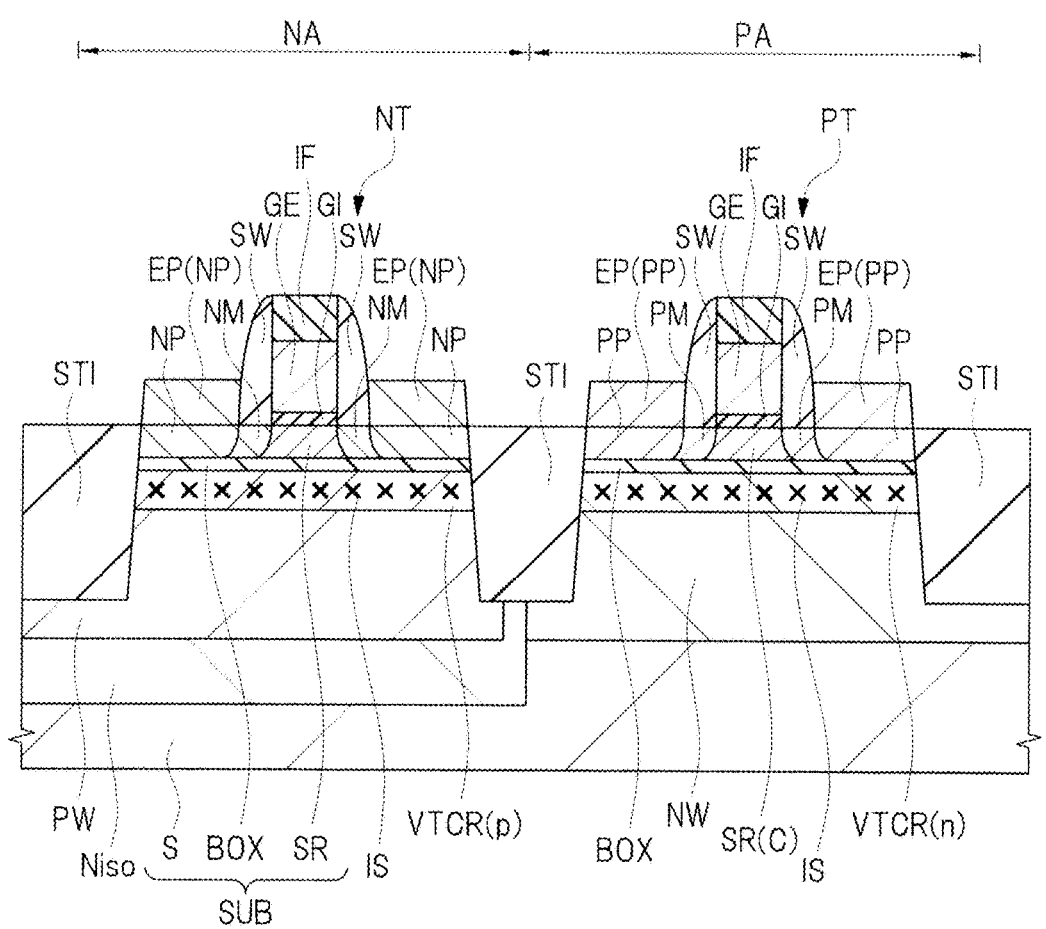
FIG. 29 is a sectional view showing the manufacturing process of the semiconductor device of the second embodiment continued from FIG. 28.

In the present embodiment, an epitaxial layer EP is formed on the n type low-concentration impurity region NM, and each of the n type high-concentration impurity regions NP is composed of the epitaxial layer EP containing an n type impurity (for example, phosphorus (P) or arsenic (As)) and the silicon layer SR (see FIG. 29). Thereafter, the epitaxial layer EP is silicided to form a metal silicide layer SIL. The n type high-concentration impurity region NP may be made of only the epitaxial layer EP containing an n type impurity. In this case, only the n type low-concentration impurity region NM is formed in the silicon layer SR. Alternatively, only a surface part of the epitaxial layer EP may be silicided to form the metal silicide layer SIL. In this case, the epitaxial layer EP containing an n type high-concentration impurity is left below the metal silicide layer SIL.

Further, in the support substrate S of the nMIS forming region NA, an n type semiconductor region Niso and the p type well region PW are formed. Then type semiconductor region Niso is formed more deeply than the p type well region PW so as to surround the p type well region PW.

The p channel MISFET (PT) is formed on the main surface of the silicon layer SR in the pMIS forming region PA. The p channel MISFET (PT) has a gate electrode GE formed on the silicon layer SR via a gate insulating film GI and source and drain regions formed in the silicon layer SR on both sides of the gate electrode GE. The source and drain regions are source and drain regions of an LDD structure. Therefore, the source and drain regions have p type low-concentration impurity regions PM formed in a self alignment manner with the gate electrode GE and p type high-concentration impurity regions PP formed in a self alignment manner with the assembled part made up of the gate electrode GE and sidewall films SW on side walls thereof. The region between the source and drain regions, that is, the region between the p type low-concentration impurity regions PM on both sides of the gate electrode GE serves as a channel forming region.

In the present embodiment, an epitaxial layer EP is formed on the p type low-concentration impurity regions PM, and each of the p type high-concentration impurity regions PP is composed of the epitaxial layer EP containing a p type impurity (for example, boron (B)) and the silicon layer SR (see FIG. 29). Thereafter, the epitaxial layer EP is silicided to form a metal silicide layer SIL. The p type high-concentration impurity region PP may be made of only the epitaxial layer EP containing a p type impurity. In this case, only the p type low-concentration impurity region PM is formed in the silicon layer SR. Alternatively, only a surface part of the epitaxial layer EP may be silicided to form the metal silicide layer SIL. In this case, the epitaxial layer EP containing a p type high-concentration impurity is left below the metal silicide layer SIL.

Also, an n type well region NW is formed in the support substrate S of the pMIS forming region PA.

Here, in the present embodiment, enhanced diffusion of a p type impurity or an n type impurity occurs by the interstitial Si (IS) in the impurity regions (VTCR(p), VTCR(n)) for threshold adjustment below the insulating layer BOX of the nMIS forming region NA and the pMIS forming region PA, and the impurity concentration of the p type impurity or the n type impurity is increased in the vicinity of the interstitial Si (IS). Therefore, the diffusion of the p type impurity or the n type impurity to the silicon layer SR can be suppressed, and the fluctuation of the transistor characteristics, for example, the fluctuation of the threshold voltage of the MISFET (NT, PT) can be reduced. The details thereof will be described later (see FIG. 30).

[Description of Manufacturing Method]

Next, the manufacturing method of the semiconductor device of the present embodiment will be described and the structure of the semiconductor device will be clarified with reference to the drawings. FIG. 22 to FIG. 29 are sectional views showing the manufacturing process of the semiconductor device of the present embodiment.

Figure 22:
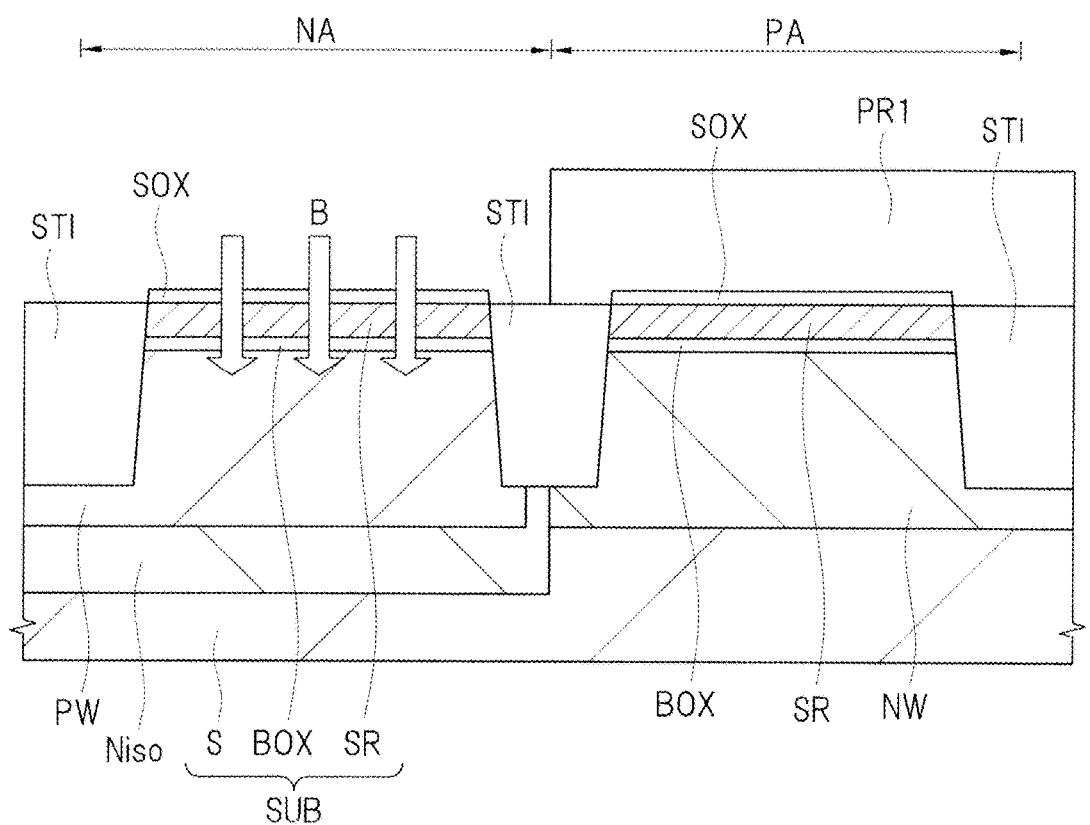
FIG. 22 is a sectional view showing a manufacturing process of the semiconductor device of the second embodiment.

As shown in FIG. 22, for example, an SOI substrate SUB is prepared as a substrate. The SOI substrate SUB is composed of a support substrate (also referred to as semiconductor substrate) S, an insulating layer (also referred to as buried insulating layer) BOX formed on the support substrate S, and a silicon layer (also referred to as semiconductor layer, semiconductor film, thin semiconductor film, or thin-film semiconductor region) SR formed on the insulating layer BOX. The support substrate S is, for example, a p type single crystal silicon substrate. The insulating layer BOX is, for example, a silicon oxide film with a thickness of about 10 to 20 nm. The silicon layer SR is made of, for example, single crystal silicon with a resistance of about 1 to 10 Ωcm and a thickness of about 10 to 20 nm. The SOI substrate SUB has an nMIS forming region NA and a pMIS forming region PA.

Subsequently, in the same manner as the first embodiment (see FIG. 3 to FIG. 5), the element isolation insulating film STI and the silicon oxide film SOX are formed on the SOI substrate SUB, and then, the n type semiconductor region Niso, the p type well region PW and the n type well region NW are formed.

Subsequently, as shown in FIG. 22 to FIG. 25, silicon (Si) is ion-implanted into the silicon layer SR and the p type impurity region VTCR(p) and the n type impurity region VTCR(n) are formed.

For example, as shown in FIG. 22, a photoresist film PR1 having an opening for the nMIS forming region NA is formed and a p type impurity (for example, boron (B)) is ion-implanted into the support substrate S below the insulating layer BOX with the photoresist film PR1 used as a mask. In this manner, the p type impurity region VTCR(p) for threshold adjustment is formed (see FIG. 23).

Figure 23:
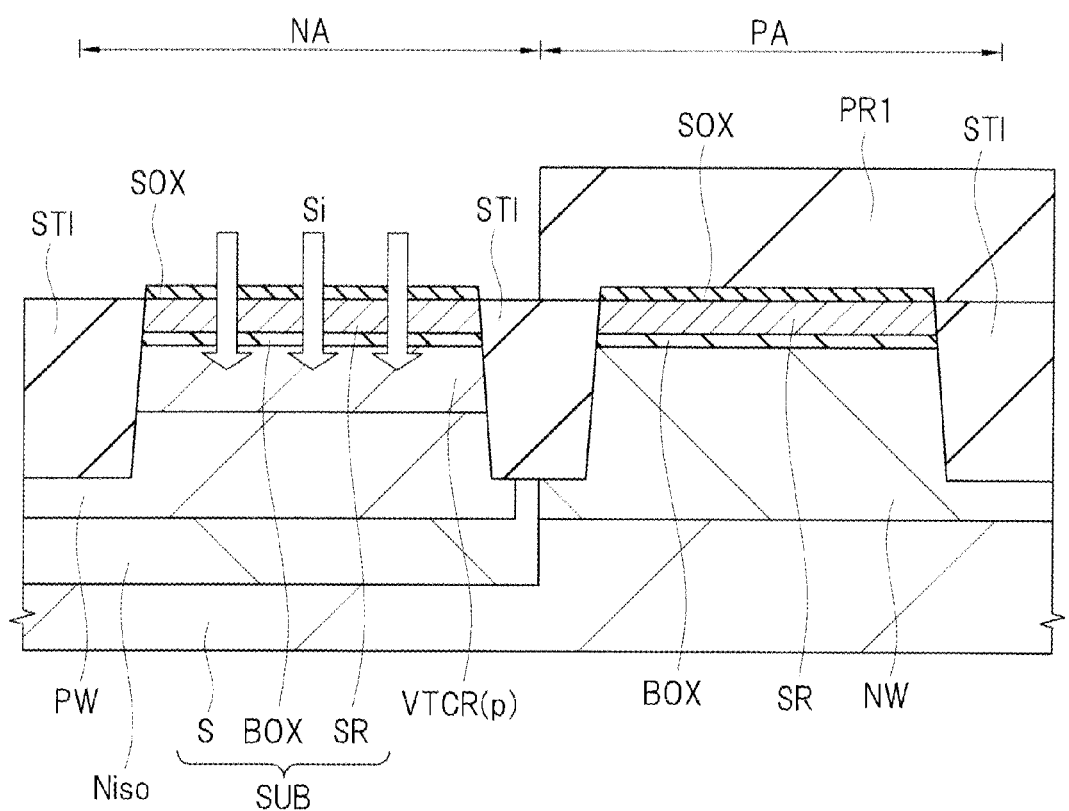
FIG. 23 is a sectional view showing the manufacturing process of the semiconductor device of the second embodiment continued from FIG. 22.

Subsequently, as shown in FIG. 23, silicon (Si) is ion-implanted into the support substrate S below the insulating layer BOX with the photoresist film PR1 used as a mask. By the implantation of silicon (Si), the interstitial Si (IS) is formed in the support substrate S below the insulating layer BOX, in this case, in the p type impurity region VTCR(p) for threshold adjustment (see FIG. 24). Thereafter, the photoresist film PR1 is removed by ashing process or the like.

Figure 24:
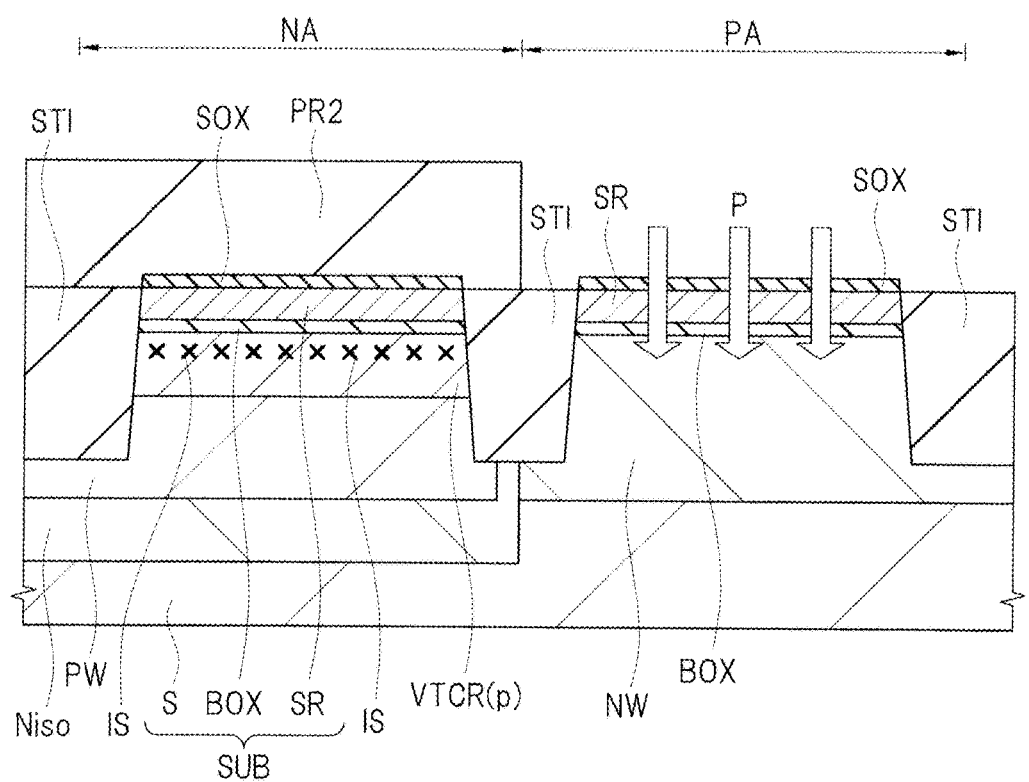
FIG. 24 is a sectional view showing the manufacturing process of the semiconductor device of the second embodiment continued from FIG. 23.

Subsequently, as shown in FIG. 24, a photoresist film PR2 having an opening for the pMIS forming region PA is formed and an n type impurity (for example, phosphorus (P)) is ion-implanted into the support substrate S below the insulating layer BOX with the photoresist film PR2 used as a mask. In this manner, the n type impurity region VTCR(n) for threshold adjustment is formed (see FIG. 25).

Figure 25:
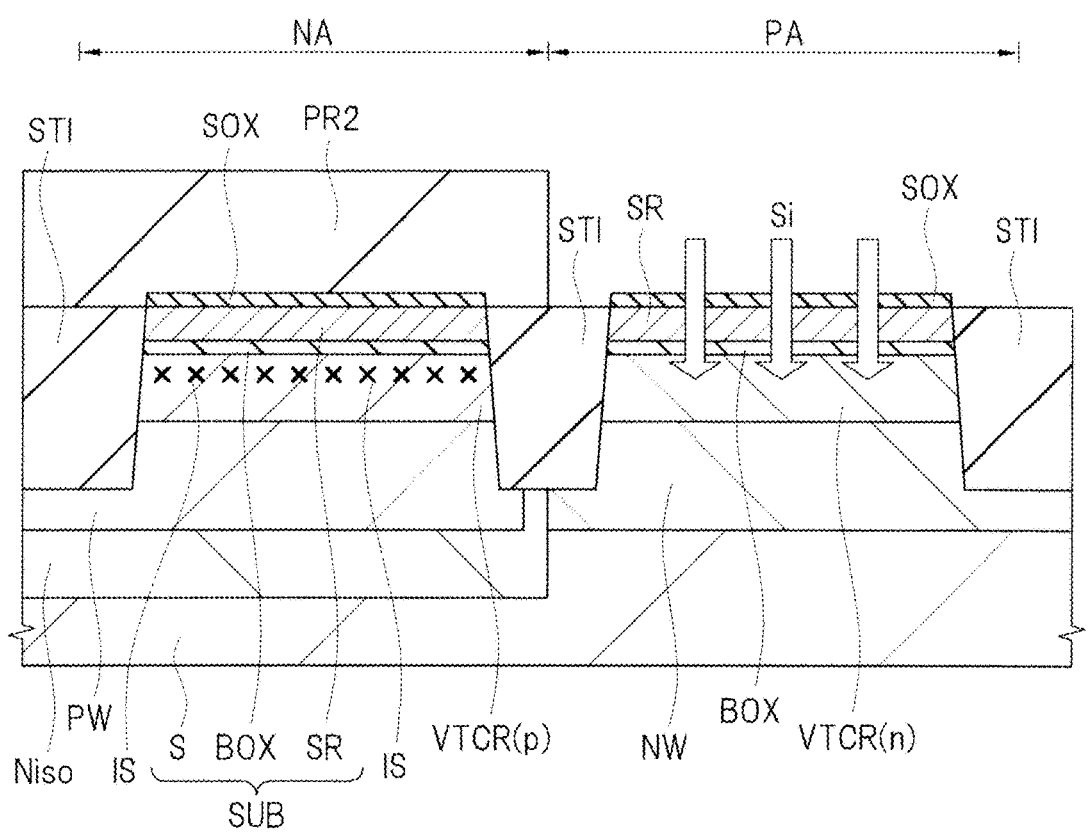
FIG. 25 is a sectional view showing the manufacturing process of the semiconductor device of the second embodiment continued from FIG. 24.
Figure 26:
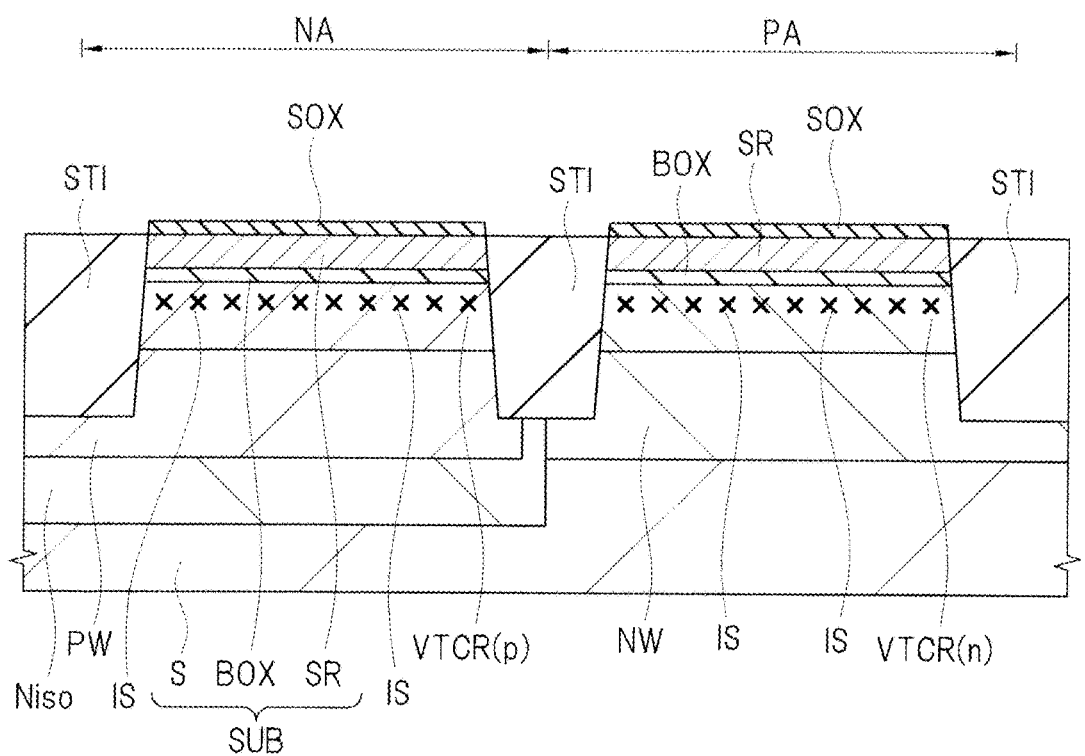
FIG. 26 is a sectional view showing the manufacturing process of the semiconductor device of the second embodiment continued from FIG. 25.

Subsequently, as shown in FIG. 25, silicon (Si) is ion-implanted into the support substrate S below the insulating layer BOX with the photoresist film PR2 used as a mask. By the implantation of silicon (Si), the interstitial Si (IS) is formed in the support substrate S below the insulating layer BOX, in this case, in the n type impurity region VTCR(n) for threshold adjustment (see FIG. 26). Thereafter, the photoresist film PR2 is removed by ashing process or the like.

Alternatively, the p type impurity region VTCR(p) may be formed after the ion implantation of silicon (Si). Also, the n type impurity region VTCR(n) may be formed after the ion implantation of silicon (Si). Further, the photoresist film for forming the n type semiconductor region Niso, the p type well region PW and the n type well region NW may be used for the ion implantation of silicon (Si), the formation of the p type impurity region VTCR(p) or the formation of the n type impurity region VTCR(n).

Figure 27:
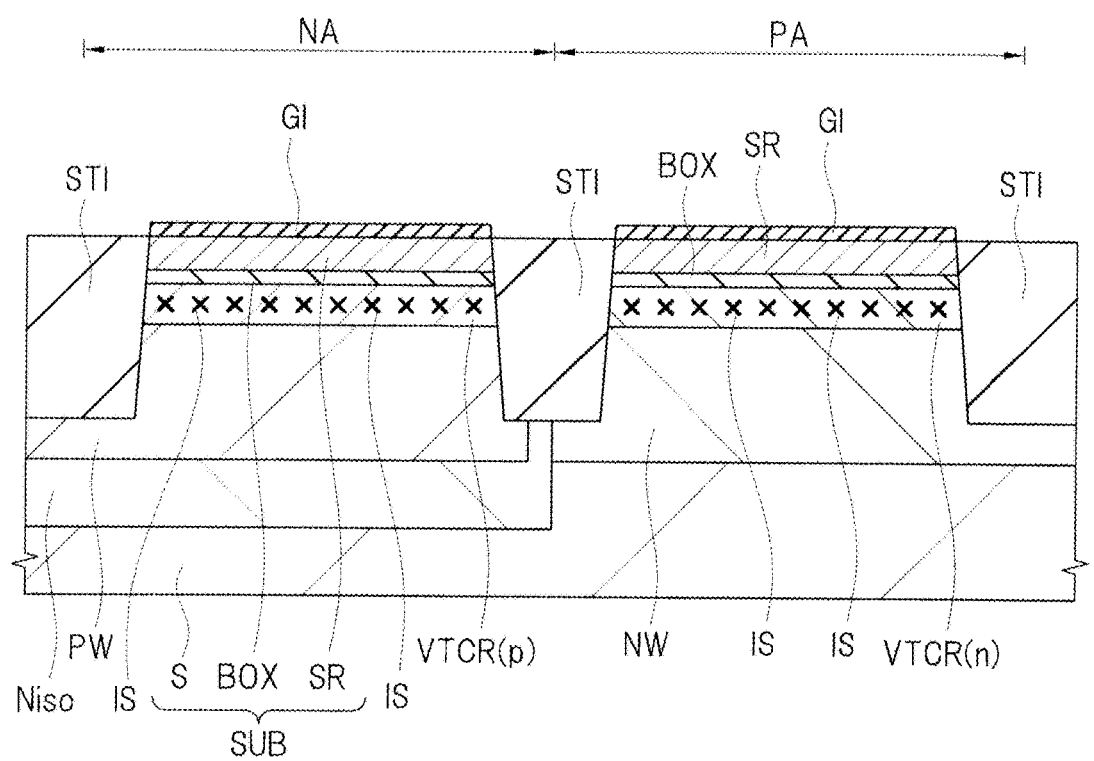
FIG. 27 is a sectional view showing the manufacturing process of the semiconductor device of the second embodiment continued from FIG. 26.

Thereafter, as shown in FIG. 27, by performing the heat treatment (annealing), the n type impurity (for example, phosphorus (P)) in the n type impurity region VTCR(n) and the p type impurity (for example, boron (B)) in the p type impurity region VTCR(p) are activated.

Here, the n type impurity (for example, phosphorus (P)) in the n type impurity region VTCR(n) and the p type impurity (for example, boron (B)) in the p type impurity region VTCR(p) are subjected to enhanced diffusion by the heat treatment mentioned above. More specifically, these impurities form pairs with the interstitial Si atoms, and anomalous diffusion clusters such as Si—B clusters and Si—P clusters are generated at the time of the heat treatment (annealing). Therefore, the impurities are collected by the anomalous diffusion in the region from the vicinity of the implantation region of the interstitial Si (IS) to the bottom surface of the insulating layer BOX, and the impurity concentration is increased. In other words, the n type impurity and the p type impurity which are to be diffused to the silicon layer SR can be captured in the region from the vicinity of the implantation region of the interstitial Si (IS) to the bottom surface of the insulating layer BOX. In this manner, the diffusion of the n type impurity and the p type impurity to the silicon layer SR can be reduced, and the fluctuation of the transistor characteristics, for example, the fluctuation of the threshold voltage of the MISFET (NT, PT) can be reduced.

Subsequently, the gate insulating film GI for the MISFET (NT, PT) is formed (FIG. 27). For example, by removing the silicon oxide film SOX by etching and thermally oxidizing the surface of the silicon layer SR(C) exposed from the nMIS forming region NA and the pMIS forming region PA, the gate insulating film GI made of the silicon oxide film (or thermally oxidized film) is formed. This gate insulating film GI may be formed by depositing a silicon oxide film by the CVD method or the like. Alternatively, a silicon oxynitride film may be used instead of a silicon oxide film. Also, a high dielectric constant film (high-k film) may be used as the gate insulating film GI.

Subsequently, in the same manner as the first embodiment, the polycrystalline silicon film SF and the insulating film IF are formed on the SOI substrate SUB, and these films are patterned, and thereby forming the gate electrode GE (see FIG. 28). At this time, the gate insulating film GI exposed from both sides of the gate electrode GE may be removed in each of the regions (NA, PA).

Subsequently, in the same manner as the first embodiment, source and drain regions of the LDD structure are formed in the silicon layer SR and others on both side of the gate electrode GE.

Figure 28:
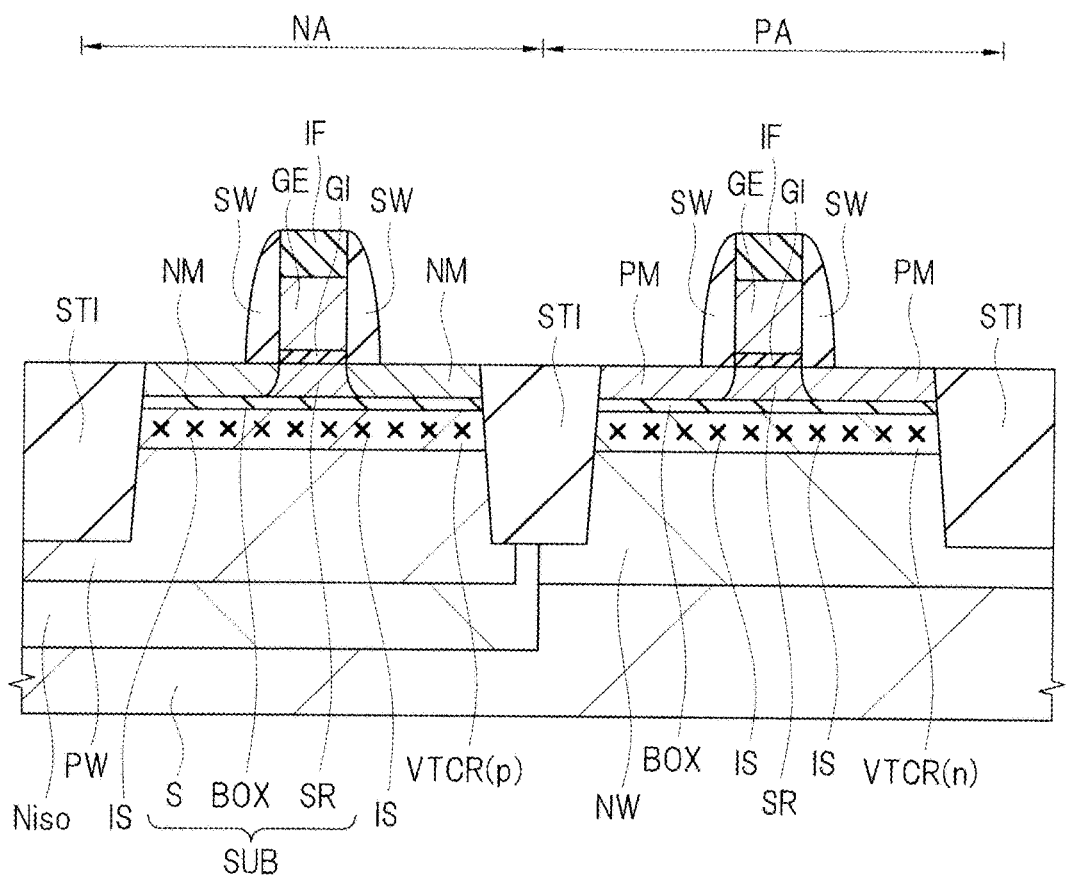
FIG. 28 is a sectional view showing the manufacturing process of the semiconductor device of the second embodiment continued from FIG. 27.

For example, as shown in FIG. 28, n type low-concentration impurity regions NM are formed in the silicon layer SR on both sides of the gate electrode GE in the nMIS forming region NA. For example, the n type low-concentration impurity regions NM are formed by introducing an n type impurity into the silicon layer SR by the ion implantation method using the photoresist film (not shown) having an opening for the nMIS forming region NA and the gate electrode GE (including insulating film IF thereon) as masks. Also, the p type low-concentration impurity regions PM are formed in the silicon layer SR on both sides of the gate electrode GE in the pMIS forming region PA. For example, the p type low-concentration impurity regions PM are formed by introducing a p type impurity into the silicon layer SR by the ion implantation method using the photoresist film (not shown) having an opening for the pMIS forming region PA and the gate electrode GE (including insulating film IF thereon) as masks.

Subsequently, sidewall films SW are formed on the side walls on both sides of the gate electrode GE. For example, after depositing an insulating film made of a silicon oxide film by the CVD method on the SOI substrate SUB including the gate electrode GE, the anisotropic etching is performed to leave the insulating film on the side walls of the gate electrode GE as the sidewall films SW.

Subsequently, as shown in FIG. 29, on the silicon layer SR exposed from both sides of the assembled part made up of the gate electrode GE and the sidewall films SW, that is, on the n type low-concentration impurity regions NM and the p type low-concentration impurity regions PM, epitaxial layers EP are formed by using the epitaxial growth method.

Subsequently, by forming a photoresist film (not shown) having an opening for the nMIS forming region NA and introducing an n type impurity into the nMIS forming region NA by the ion implantation method using the assembled part made up of the gate electrode GE (including insulating film IF thereon) and the sidewall films SW as a mask, the n type high-concentration impurity regions NP are formed. Then, by forming a photoresist film (not shown) having an opening for the pMIS forming region PA and introducing a p type impurity into the pMIS forming region PA by the ion implantation method using the assembled part made up of the gate electrode GE (including insulating film IF thereon) and the sidewall films SW as a mask, the p type high-concentration impurity regions PP are formed.

By the process described above, the n channel MISFET (NT) having the source and drain regions of the LDD structure composed of the n type low-concentration impurity regions NM and the n type high-concentration impurity regions NP can be formed. Also, the p channel MISFET (PT) having the source and drain regions of the LDD structure composed of the p type low-concentration impurity regions PM and the p type high-concentration impurity regions PP can be formed.

As described above, in the present embodiment, the threshold value of the n channel MISFET (NT) can be adjusted by forming the p type impurity region VTCR(p) in the support substrate S below the insulating layer BOX in the nMIS forming region NA. Also, the threshold value of the p channel MISFET (PT) can be adjusted by forming the n type impurity region VTCR(n) in the support substrate S below the insulating layer BOX in the pMIS forming region PA.

In addition, the diffusion of an impurity from the p type impurity region VTCR(p) and n type impurity region VTCR(n), which are impurity regions for threshold adjustment, to the silicon layer SR can be reduced by the interstitial Si (IS). In this manner, the deterioration of the characteristics of the MISFET (NT, PT) can be reduced.

Figure 30A:
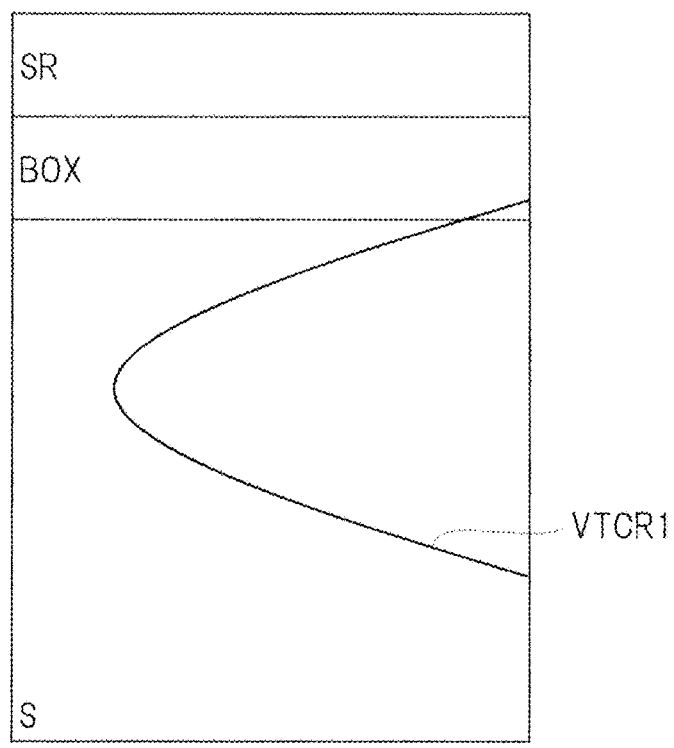
FIG. 30A is a graph showing an impurity concentration and interstitial silicon in an impurity region for threshold adjustment.

FIG. 30 is a graph showing an impurity concentration and the interstitial silicon Si in the impurity region VTCR for threshold adjustment. The vertical axis represents a depth of the SOI substrate, and the horizontal axis represents the concentration of an impurity and interstitial Si. In the state where the support substrate S, the insulating layer BOX and the silicon layer SR are sequentially deposited in this order from the lower side of the SOI substrate as shown in FIG. 30A, the impurity concentration of the impurity region VTCR is indicated by the graph VTCR1 after the ion implantation. More specifically, the impurity concentration reaches its peak in the support substrate S just below the insulating layer BOX, and the concentration is lowered as moving toward the surface from the peak position to the insulating layer BOX and the silicon layer SR. In this case, the peak of the impurity concentration is located at a relatively deep position of the silicon layer below the insulating layer BOX so that the tail of the graph of the impurity concentration does not reach the silicon layer SR. It is preferred that the implantation energy of the ion implantation is adjusted in this manner.

Figure 30B:
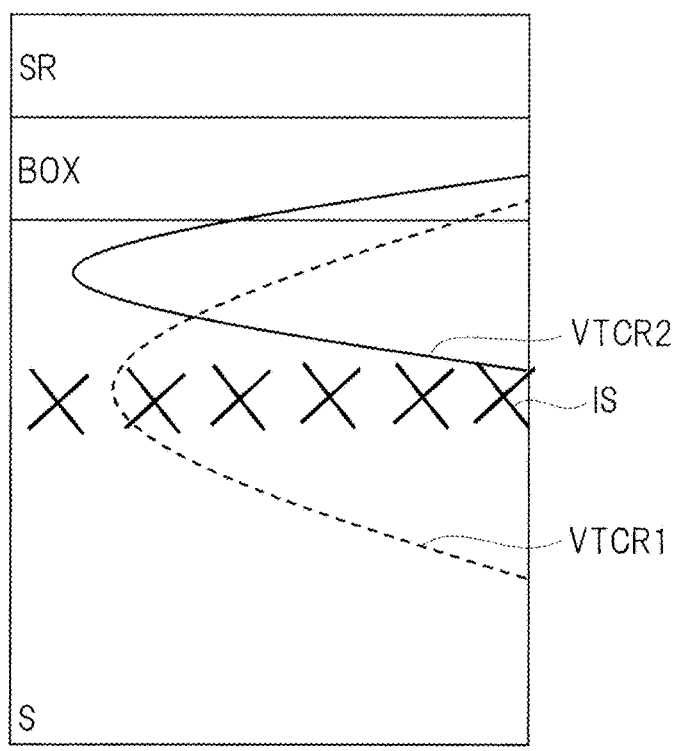
FIG. 30B is a graph showing an impurity concentration and interstitial silicon in an impurity region for threshold adjustment.

Also, as shown in FIG. 30B, the interstitial Si (IS) is formed in the support substrate S below the insulating layer BOX, in this case, in the vicinity of the peak position of the impurity concentration of the impurity region VTCR. In this case, the graph VTCR1 after the ion implantation is changed to the graph VTCR2 by the heat treatment. More specifically, the impurity concentration is increased by the enhanced diffusion, and the peak thereof comes closer to the bottom part of the insulating layer BOX. As described above, even when an impurity is implanted at a deep position at a relatively low concentration so that the tail of the graph of the impurity concentration does not reach the silicon layer SR (graph VTCR1), the impurity concentration just below the insulating layer BOX can be increased by the anomalous diffusion by the interstitial Si. Further, by increasing the impurity concentration in the region from the vicinity of the implantation region of the interstitial Si (IS) to the bottom surface of the insulating layer BOX, the diffusion of an n type impurity and a p type impurity to the silicon layer SR can be reduced, and the fluctuation of the transistor characteristics, for example, the fluctuation of the threshold voltage of the MISFET (NT, PT) can be reduced.

In the embodiment described above, silicon (Si) is implanted as interstitial atoms, but germanium (Ge) or iron (Fe) may be implanted instead.

Also, in the embodiment described above, after the impurity region VTCR is formed in the nMIS forming region NA and the pMIS forming region PA, the ion implantation of silicon (Si) into the silicon layer SR is performed. However, these processes may be performed in reverse order. More specifically, the impurity region VTCR may be formed after the ion implantation of silicon (Si).

Also, in the embodiment described above, after the formation of the p type impurity region VTCR(p) and the ion implantation of silicon (Si) are performed to the nMIS forming region NA, the formation of the n type impurity region VTCR(n) and the ion implantation of silicon (Si) are performed to the pMIS forming region PA. However, these processes may be performed in reverse order. More specifically, the implantation of silicon (Si) and a p type impurity into the nMIS forming region NA may be performed after the implantation of Si and an n type impurity into the pMIS forming region PA.

Figure 31:
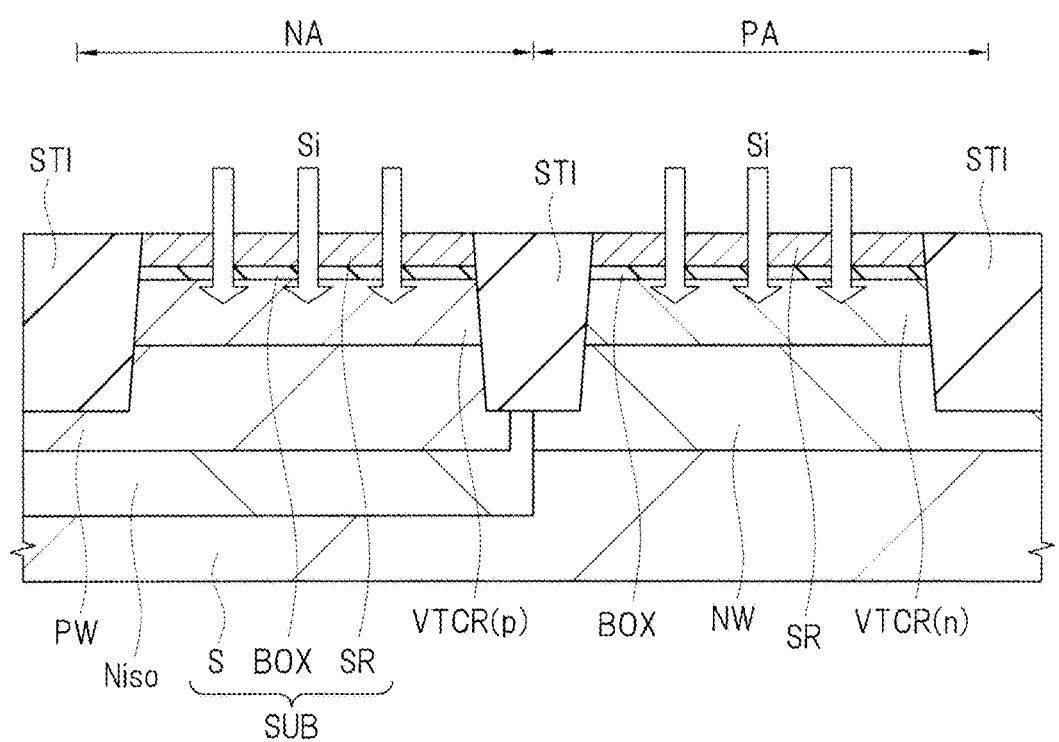
FIG. 31 is a sectional view showing another manufacturing process of the semiconductor device of the second embodiment.

Alternatively, the ion implantation of silicon (Si) and the formation of the impurity region VTCR may be performed by the process described below. FIG. 31 is a sectional view showing another manufacturing process of the semiconductor device of the present embodiment.

First, the SOI substrate SUB composed of the support substrate S, the insulating layer BOX formed on the support substrate S, and the silicon layer SR formed on the insulating layer BOX is prepared. Then, as described in the first embodiment with reference to FIG. 3 to FIG. 5, the element isolation insulating film STI and the silicon oxide film SOX are formed on the SOI substrate SUB, and the n type semiconductor region Niso, the p type well region PW and the n type well region NW are formed.

Subsequently, a p type impurity (for example, boron (B)) is ion-implanted into the support substrate S below the insulating layer BOX with a photoresist film (not shown) having an opening for the nMIS forming region NA used as a mask. In this manner, the p type impurity region VTCR(p) for threshold adjustment is formed (see FIG. 18). Thereafter, the photoresist film is removed by ashing process or the like.

Subsequently, an n type impurity (for example, phosphorus (P)) is ion-implanted into the support substrate S below the insulating layer BOX with a photoresist film (not shown) having an opening for the pMIS forming region PA used as a mask. In this manner, the n type impurity region VTCR(n) for threshold adjustment is formed (see FIG. 19). Thereafter, the photoresist film is removed by ashing process or the like.

Subsequently, as shown in FIG. 31, silicon (Si) is ion-implanted into the support substrate S of the nMIS forming region NA and the pMIS forming region PA (in this case, the p type impurity region VTCR(p) and the n type impurity region VTCR(n)), and thereby forming interstitial Si (IS).

Thereafter, by performing the heat treatment, the n type impurity (for example, phosphorus (P)) in the n type impurity region VTCR(n) and the p type impurity (for example, boron (B)) in the p type impurity region VTCR(p) are activated.

Also in this process, the n type impurity (for example, phosphorus (P)) in the n type impurity region VTCR(n) and the p type impurity (for example, boron (B)) in the p type impurity region VTCR(p) are subjected to enhanced diffusion by the heat treatment mentioned above. More specifically, these impurities form pairs with the interstitial Si atoms, and anomalous diffusion clusters such as Si—B clusters and Si—P clusters are generated at the time of the heat treatment (annealing). Therefore, the impurity concentration is increased by the anomalous diffusion in the region from the vicinity of the implantation region of the interstitial Si (IS) to the bottom surface of the insulating layer BOX. In other words, the n type impurity and the p type impurity which are to be diffused to the silicon layer SR can be captured in the region mentioned above while increasing the impurity concentration just below the insulating layer BOX. In this manner, the diffusion of the n type impurity and the p type impurity to the silicon layer SR can be reduced, and the fluctuation of the transistor characteristics, for example, the fluctuation of the threshold voltage of the MISFET (NT, PT) can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device comprising the steps of:
    (a) preparing a substrate having a semiconductor substrate, an insulating layer formed on the semiconductor substrate, and a semiconductor layer formed on the insulating layer;
    (b) forming a semiconductor region by ion-implanting an n type impurity or a p type impurity into the semiconductor substrate such that an impurity concentration profile of the p type or n type impurity extends from the semiconductor region through the insulating layer and into the semiconductor layer, the impurity concentration profile having a maximum in the semiconductor region, the semiconductor region being below the insulating layer;
    (c) ion-implanting carbon into the semiconductor layer such that the p type or n type impurity in the semiconductor layer is inactivated by the carbon in the semiconductor layer; and
    (d) after the steps (b) and (c), forming a field effect transistor on a main surface of the semiconductor layer.

2. The manufacturing method of a semiconductor device according to claim 1, wherein the step (c) is performed after the step (b).

3. The manufacturing method of a semiconductor device according to claim 1, wherein the step (b) is performed after the step (c).

4. The manufacturing method of a semiconductor device according to claim 1, further comprising the step of: after the step (c), performing heat treatment.

5. The manufacturing method of a semiconductor device according to claim 1, wherein the field effect transistor is an n channel MISFET.

6. The manufacturing method of a semiconductor device according to claim 1, wherein the field effect transistor is a p channel MISFET.

* * * * *